(12) United States Patent
Caprara et al.

(10) Patent No.: US 6,825,523 B2
(45) Date of Patent: Nov. 30, 2004

(54) PROCESS FOR MANUFACTURING A DUAL CHARGE STORAGE LOCATION MEMORY CELL

(75) Inventors: Paolo Caprara, Milan (IT); Claudio Brambilla, Concorezzo (IT); Manlio Sergio Cereda, Lomagna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/267,033

(22) Filed: Oct. 7, 2002

(65) Prior Publication Data

US 2003/0067032 A1 Apr. 10, 2003

(30) Foreign Application Priority Data

Oct. 8, 2001 (EP) .............................................. 01830634

(51) Int. Cl.[7] .............................................. H01L 29/76
(52) U.S. Cl. ........................ 257/314; 257/316; 257/324; 257/332; 438/259; 438/261; 438/262; 438/265; 438/267
(58) Field of Search ................................ 257/314–316, 257/324, 332; 438/257, 259, 261–267

(56) References Cited

U.S. PATENT DOCUMENTS

| | | |
|---|---|---|
| 5,408,115 A | 4/1995 | Chang |
| 5,949,711 A | 9/1999 | Kazerounian |
| 6,201,282 B1 | 3/2001 | Eitan |
| 6,248,633 B1 | 6/2001 | Ogura et al. |
| 6,335,554 B1 | 1/2002 | Yoshikawa |
| 6,413,821 B1 * | 7/2002 | Ebina et al. ................. 438/257 |

FOREIGN PATENT DOCUMENTS

WO PCT/US00/23484 3/2001

OTHER PUBLICATIONS

Patent Abstracts Of Japan. vol. 2000, No. 23, Feb. 10, 2001 & JP 2001 156188 A (Toshiba Corp), Jun. 8, 2001 *abstract*.

European Search Report, EP 01 83 0634.

* cited by examiner

Primary Examiner—Hsien Ming Lee
(74) Attorney, Agent, or Firm—Lisa K. Jorgenson; P. G. Scott Born; Graybeal Jackson Haley LLP

(57) ABSTRACT

A process for manufacturing a dual charge storage location electrically programmable memory cell that includes the steps of forming a central insulated gate over a semiconductor substrate; forming physically separated charge-confining layers stack portions of a dielectric-charge trapping material-dielectric layers stack at the sides of the central gate, the charge trapping material layer in each charge-confining layers stack portion forming a charge storage element; forming side control gates over each of the charge-confining layers stack portions; forming memory cell source/drain regions laterally to the side control gates; and electrically connecting the side control gates to the central gate. Each of the charge-confining layers stack portions at the sides of the central gate is formed with an "L" shape, with a base charge-confining layers stack portion lying on the substrate surface and an upright charge-confining layers stack portion lying against a respective side of the insulated gate.

27 Claims, 19 Drawing Sheets

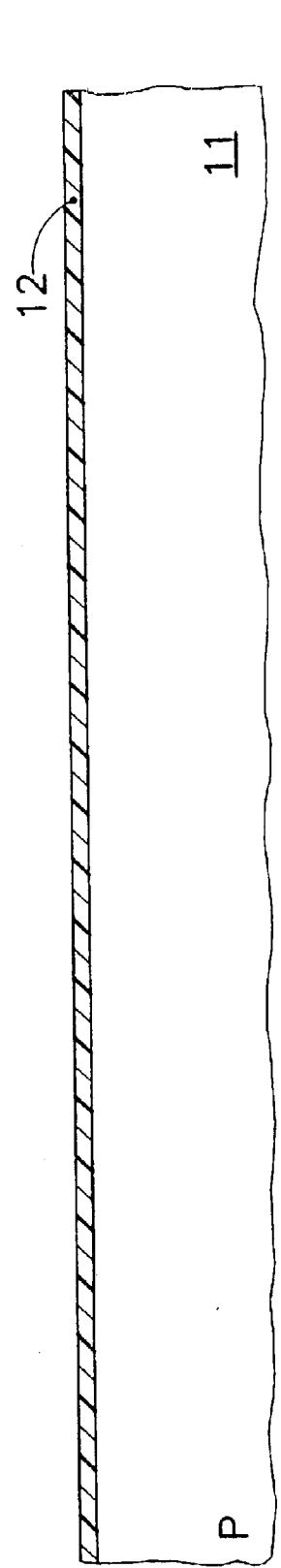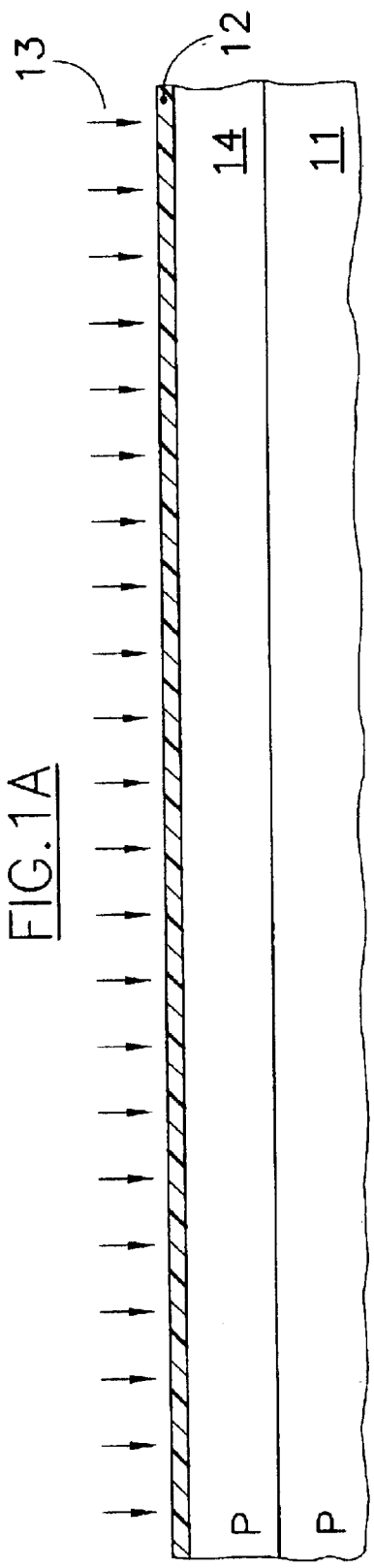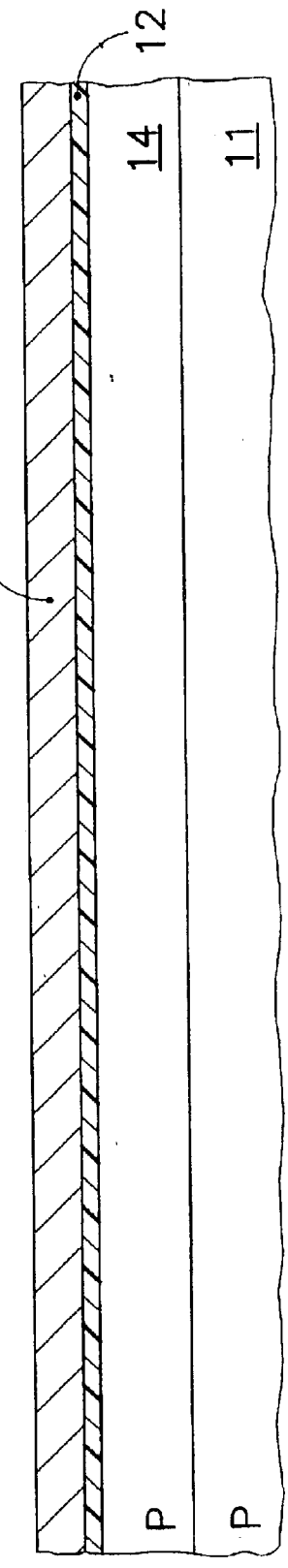

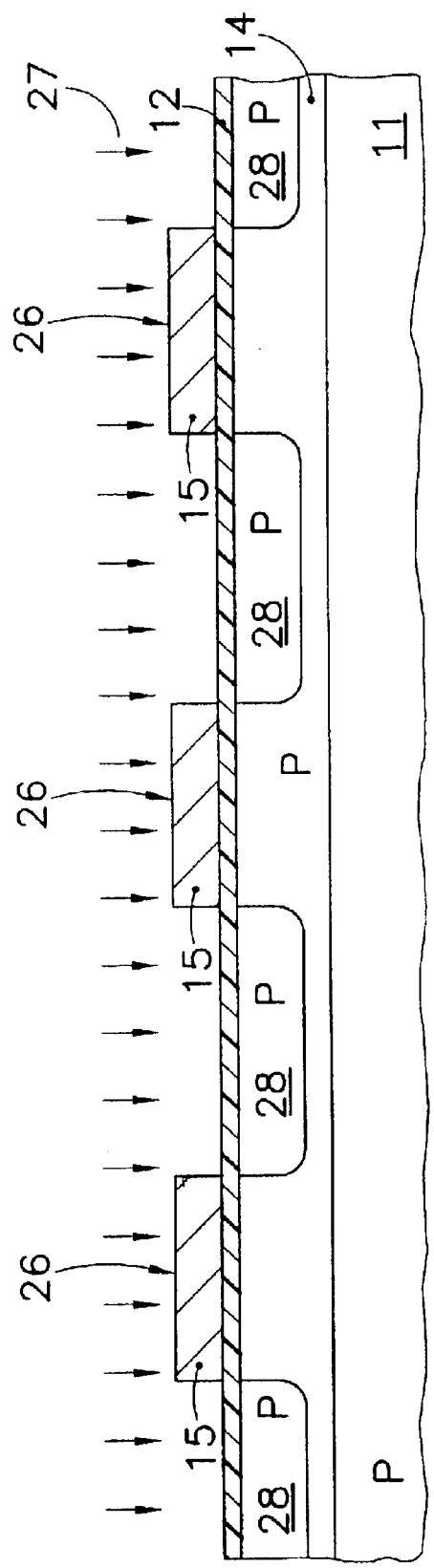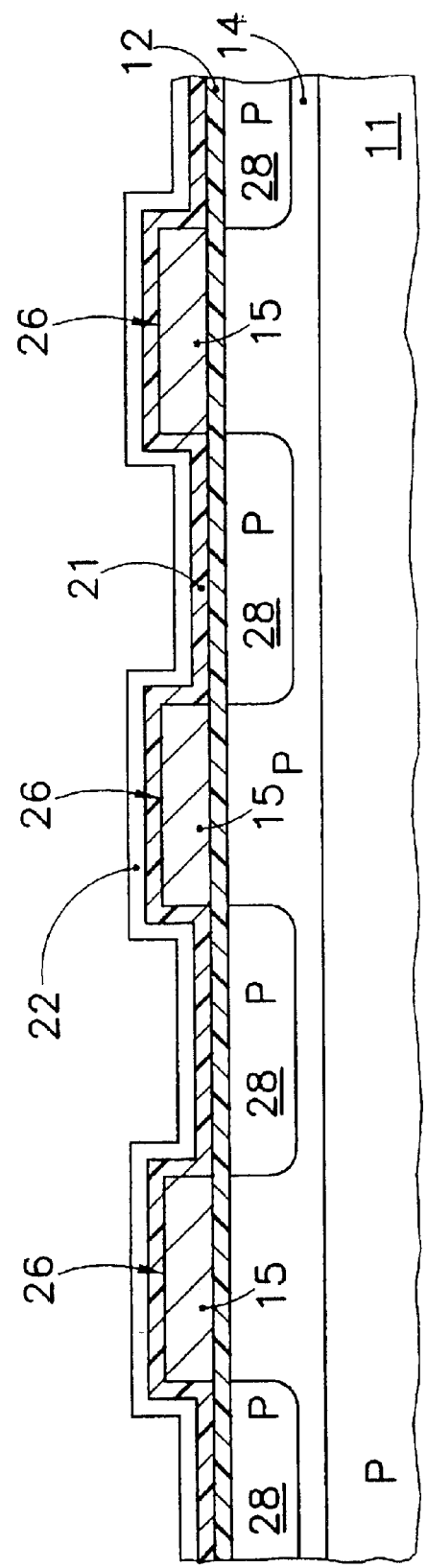
FIG.2A
FIG.2B

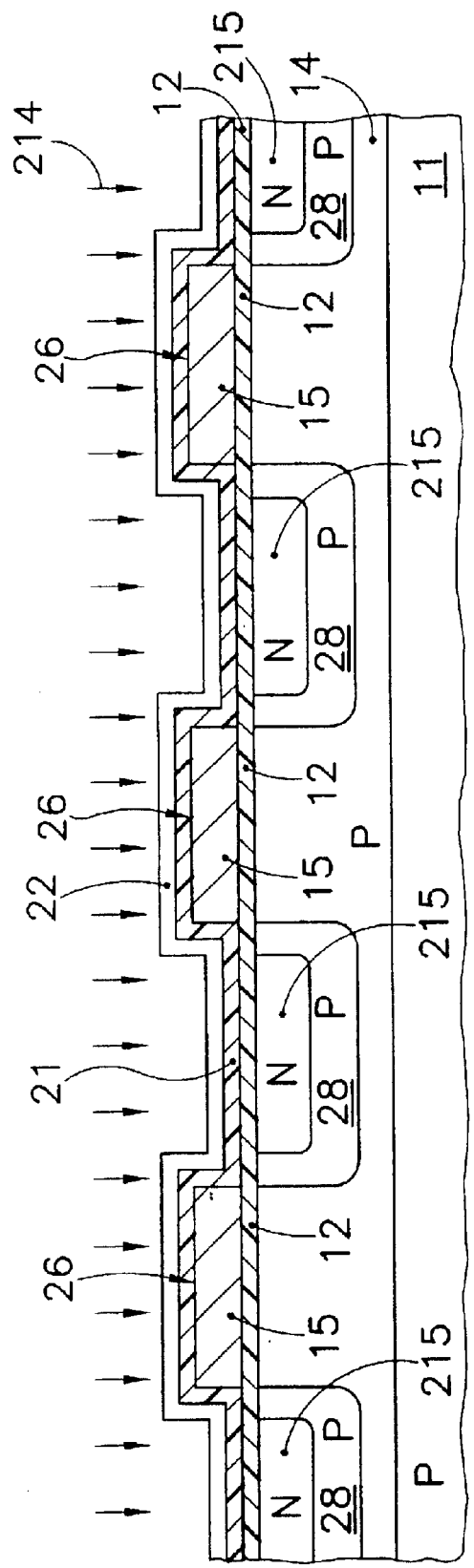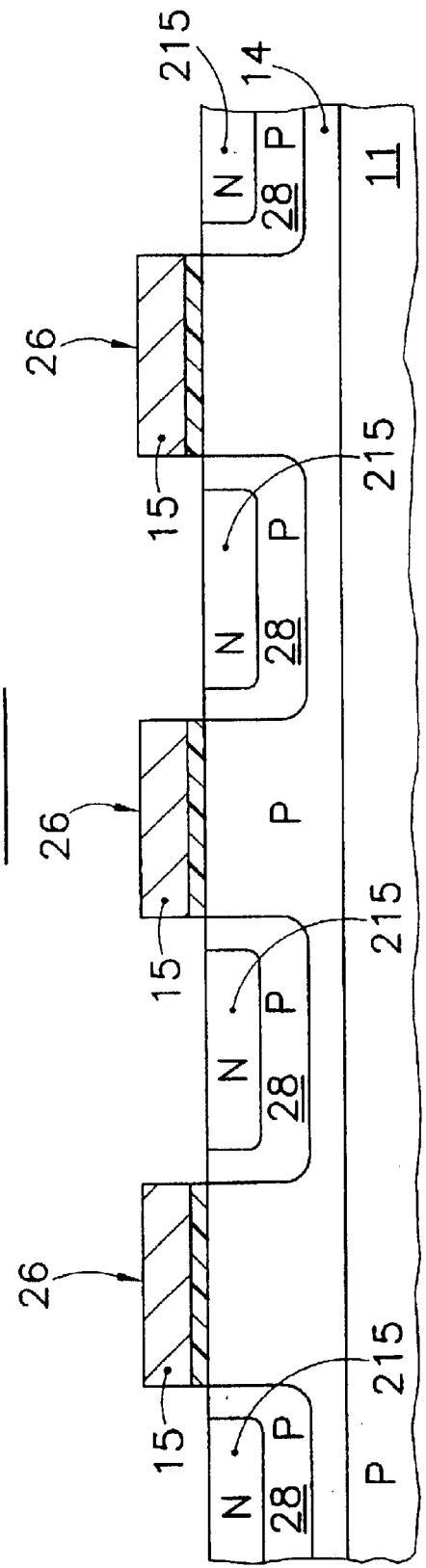

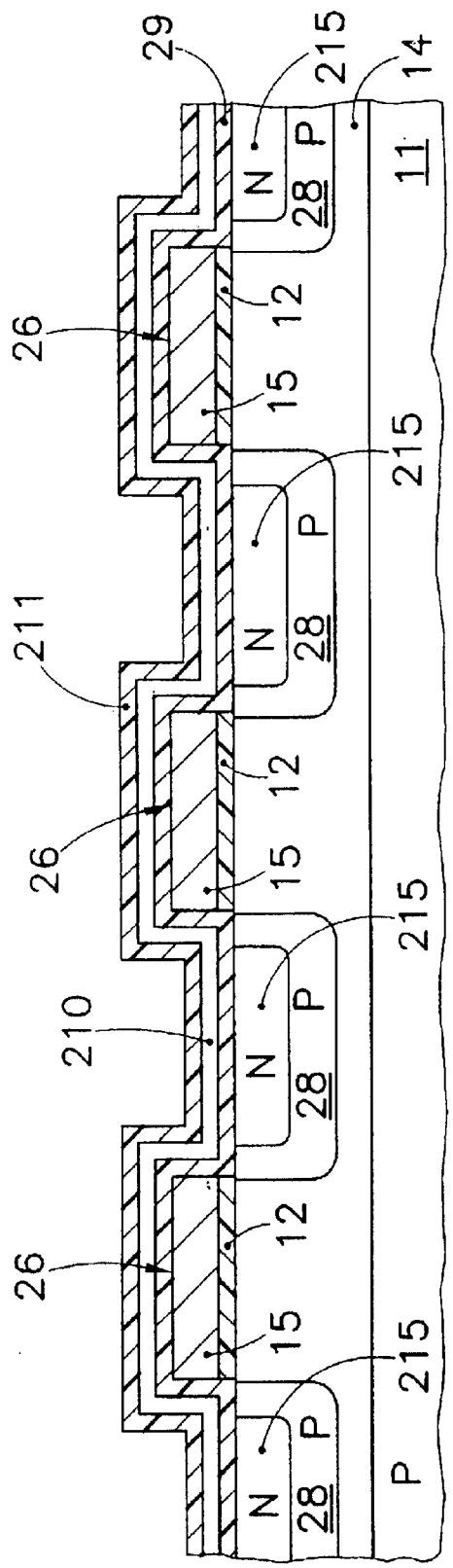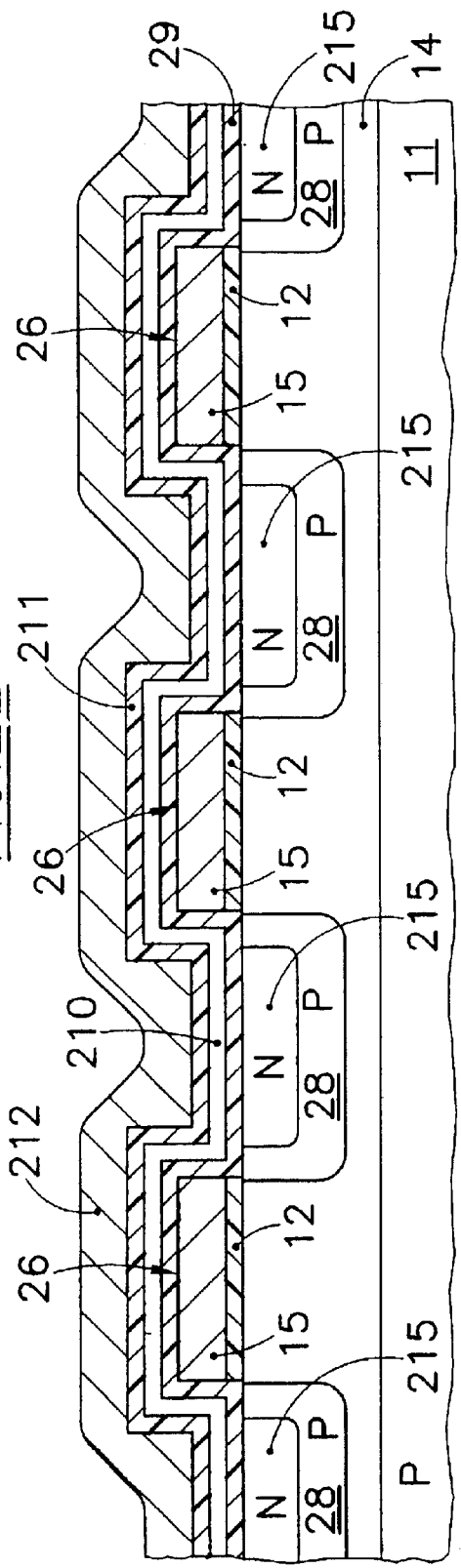
FIG.2E
FIG.2F

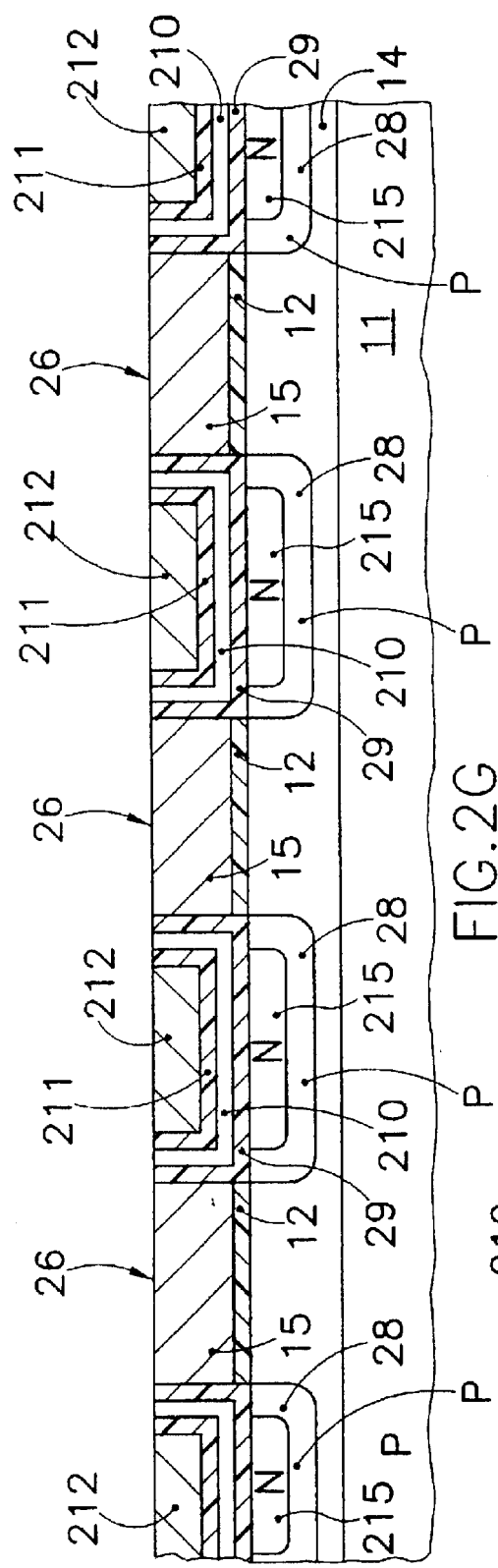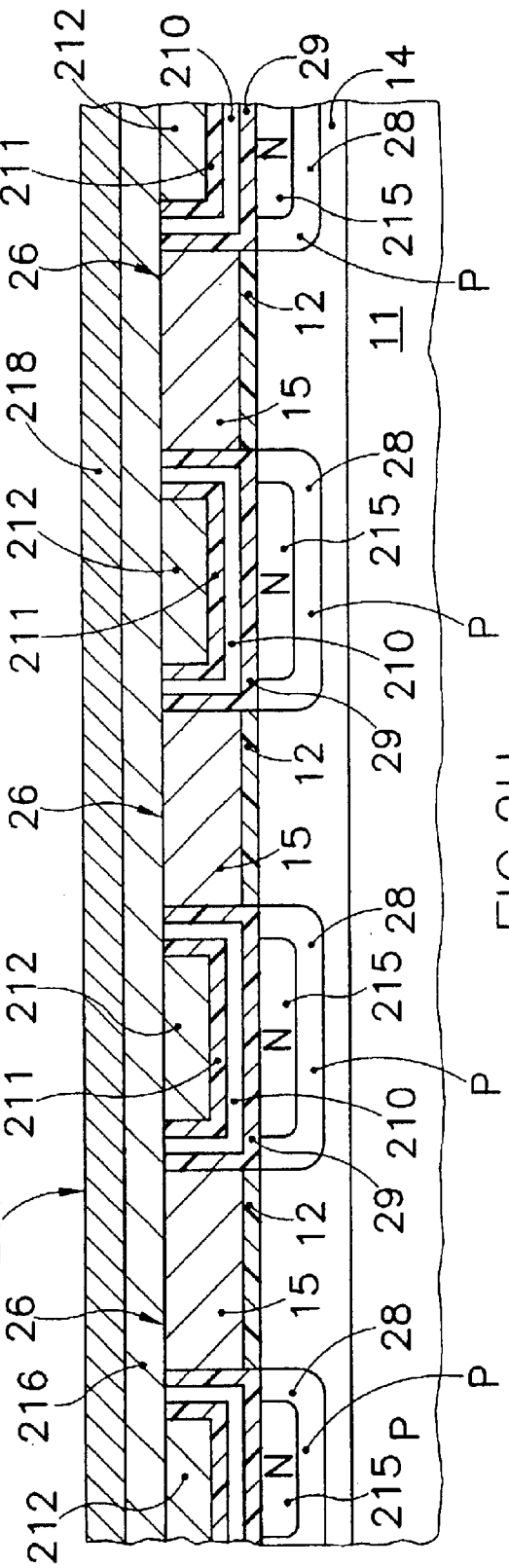

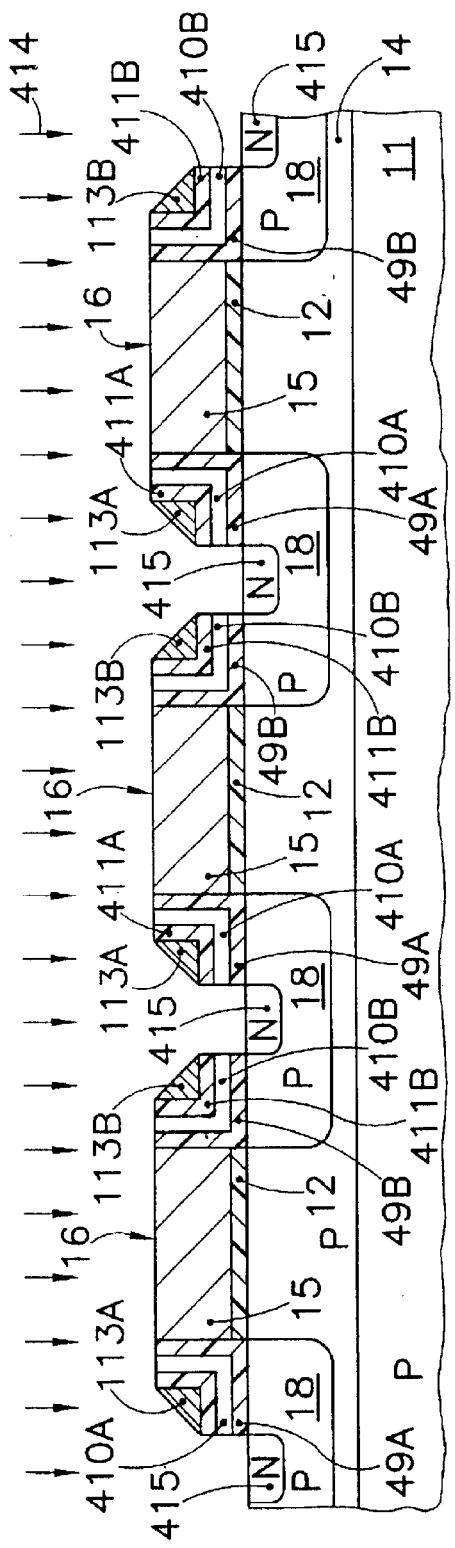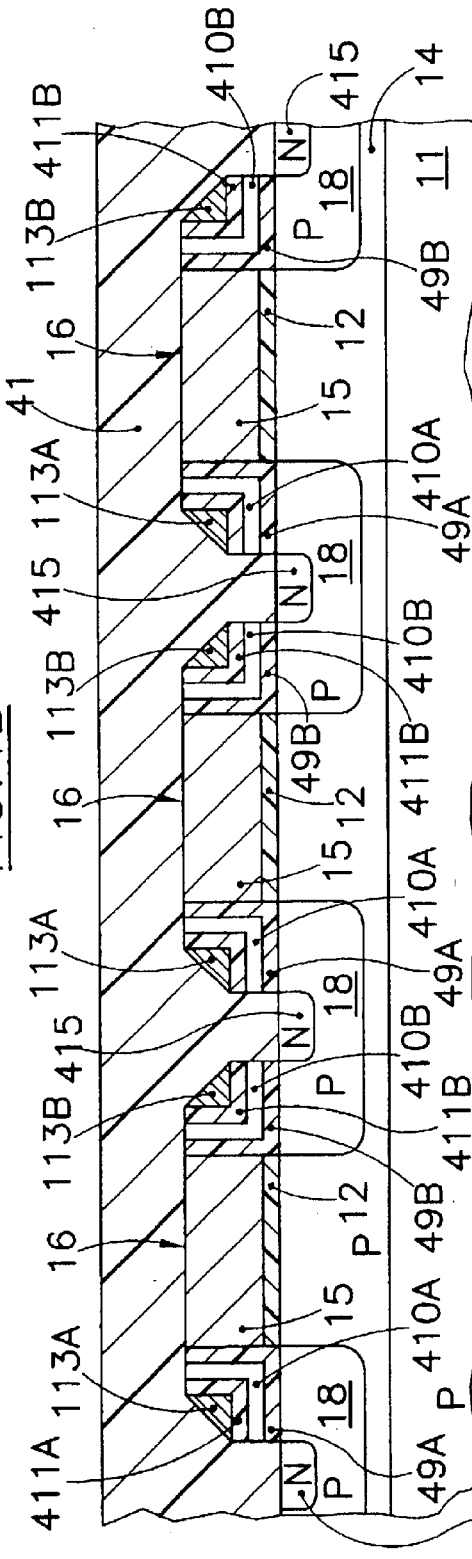

PROCESS FOR MANUFACTURING A DUAL CHARGE STORAGE LOCATION MEMORY CELL

CROSS-REFERENCE TO RELATED APPLICATION

The present application claims priority from European patent application no. 01830634.0, filed Oct. 8, 2001, entitled PROCESS FOR MANUFACTURING A DUAL CHARGE STORAGE LOCATION MEMORY CELL, presently pending.

BACKGROUND OF THE INVENTION

The present invention relates generally to the field of semiconductor memories, particularly non-volatile memories and still more particularly to electrically programmable non-volatile memories. More specifically, the invention concerns dual charge storage location non-volatile semiconductor memory cells and, in particular, the manufacturing thereof.

As known, the information storage mechanism in non-volatile memory cells such as EPROMs, EEPROMs and Flash EEPROMs is based on the possibility of having an electric charge trapped in a charge storage element. The presence of the electric charge in the charge storage element causes a change in the memory cell threshold voltage, that can be assessed by measuring a current sunk by the memory cell in a prescribed bias condition.

Typically, the charge storage element is represented by a polysilicon floating gate insulatively placed over the memory cell channel region and capacitively coupled to a control gate. Charge carriers can be injected into the floating gate by means of the hot electron injection mechanism, as in EPROMs and Flash EPROMs, or by tunnelling, as in EEPROMs. The presence of an electric charge in the floating gate affects the formation of a conductive channel in the channel region.

Up to some years ago, each memory cell was used to store one bit of information, corresponding to the absence of charge in the floating gate (a condition conventionally interpreted as a logic "1") or the presence (logic "0") in the floating gate of an electric charge equal to or greater than a prescribed minimum amount.

The constant trend towards the increase of semiconductor memory storage capacity per unit chip area has however suggested that each memory cell could be used to store more than one bit.

Memory cells have therefore been proposed having multiple threshold voltage levels. In such memory cells, commonly referred to as multi-level memory cells, the amount of charge trapped in the floating gate is precisely controlled and can take more than two values, for example four. To each value of electric charge there corresponds a respective threshold voltage of the memory cell. A multi-level memory cell having for example four admissible threshold voltages is able to store two bits.

More recently, memory cells having two charge storage locations have been proposed. In these memory cells it is possible to have an electric charge trapped in two physically distinct locations of the memory cell, normally at each side of the channel region thereof, near the source/drain regions.

Two types of dual charge storage location memory cells are known in the art.

A first type of dual charge storage location memory cell is described for example in U.S. Pat. No. 5,949,711. The memory cell comprises a control gate insulatively placed over a channel region. At both sides of the control gate, near the source/drain diffusions, two electrically isolated spacers of polysilicon form two floating gates.

Charge can be selectively injected into each floating gate and be trapped therein. Each floating gate controls a short portion of the memory cell channel.

Each one of the source/drain diffusions acts as a source electrode when reading the value of the charge trapped in the adjacent floating gate, and as a drain electrode when reading the value of the charge trapped in the opposite floating gate.

As the traditional single bit or multi-level memory cells having a single floating gate, this dual charge storage location memory cell relies for its operation on the capacitive coupling between the control gate and the two floating gates.

However, due to the physical location of the two floating gates at the sides of the control gate, the areas of coupling between the latter and the former are rather small. The capacitive coupling between the control gate and the floating gate is therefore scarce, thus allowing a small amount of charge to be injected.

A second type of dual charge storage location memory cells is described for example in U.S. Pat. No. 6,201,282 B1. In this case the memory cell comprises a control gate insulatively placed over a channel region with interposition of an oxide-nitride-oxide (ONO) stack of layers. Charge can be injected into and trapped in two separated and separately chargeable areas found within the nitride layer, near the memory cell source/drain regions. The latter, as in the dual charge storage location memory cell described above, change their role while reading the charge trapped in one or the other of the two areas.

Compared to the one previously described, this dual charge storage location memory cell requires one less polysilicon layer, which simplifies the manufacturing process. However, this structure is affected by problems of confinement of the charge in the two areas within the nitride layer. It is in fact difficult to keep the two charges separated, since there is no physical separation therebetween. This problem arises in the memory cell writing and erasing operations, as well as during the memory cell life, and may cause the loss of the stored information.

In U.S. Pat. No. 6,248,633 B1 a dual charge storage location memory cell with a twin MONOS structure is disclosed. The memory cell comprises two polysilicon sidewall control gates placed over a composite ONO stack on both sides of a polysilicon word gate. The latter is placed over a gate oxide layer.

The nitride within the ONO stack of layers which is under each sidewall control gate is the region for electron memory storage. Since the two nitride layer regions under the two sidewall control gates are physically separated from each other, this structure appears not to be affected by the problem of charge confinement previously discussed.

However, the various processes for manufacturing the MONOS dual charge storage location memory cell described in that document appear to the Applicant rather complicated. For example, use is made of disposable polysilicon sidewall spacers to fabricate the memory cell channel, which increases the process steps.

In view of the state of the art described, it has been an object of the present invention to provide an alternative manufacturing process for a dual charge storage location electrically programmable memory cell.

SUMMARY OF THE INVENTION

According to an aspect of the present invention, there is provided a process for manufacturing a dual charge storage location electrically programmable memory cell. The process provides for forming a central insulated gate over a semiconductor substrate; forming physically separated charge confining stack portions of a dielectric-charge trapping material-dielectric layers stack at the sides of the central gate, the charge trapping material layer in each charge confining stack portion forming a charge storage element; forming side control gates over each of the charge confining stack portions; forming memory cell source/drain regions laterally to the side control gates; electrically connecting the side control gates to the central gate.

Each of the charge confining stack portions at the sides of the central gate is formed with an "L" shape, with a base charge-confining stack portion lying on the substrate surface and an upright charge confining stack portion lying against a respective side of the central gate.

According to another aspect of the present invention, there is provided a process for manufacturing an array of dual charge storage location electrically programmable memory cells.

BRIEF DESCRIPTION OF THE DRAWINGS

The features and advantages of the present invention will be made apparent by the following detailed description of some embodiments thereof, provided merely by way of non-limitative examples with reference to the attached drawings, wherein:

FIGS. 1A to 1M are cross-sectional views showing some steps of a manufacturing process according to a first embodiment of the present invention;

FIGS. 2A to 2H are cross-sectional views showing some steps of a manufacturing process according to a second embodiment of the present invention;

FIGS. 4A to 4E are cross-sectional views showing some steps of a manufacturing process according to a fourth embodiment of the present invention.

In the following, same reference numerals will be adopted to identify same parts in the different embodiments of the invention, which will be described.

DETAILED DESCRIPTION OF THE PREFERRED EMBODIMENTS

Figure 1D:
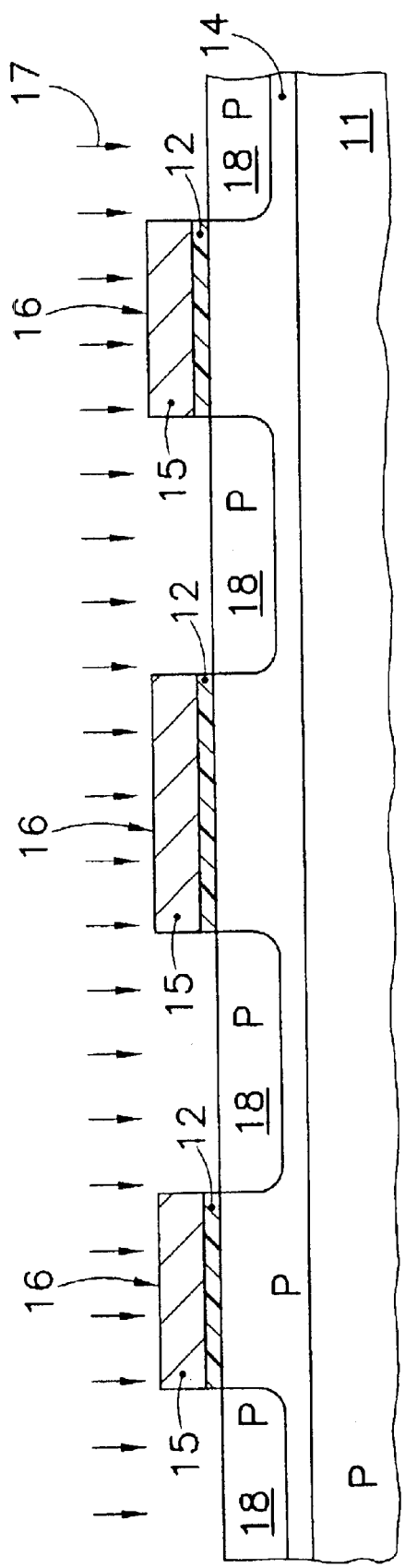

FIGS. 1A to 1M are schematic cross-sectional views showing a portion of a memory cell array during the main steps of a manufacturing process according to a first embodiment of the present invention.

With reference to FIG. 1A, reference numeral 11 indicates a semiconductor, e.g. silicon, substrate, or alternatively a doped well formed in a semiconductor substrate (in this case, the substrate being not visible in the drawings). In the context of this description the term substrate is to be intended as encompassing both of the alternatives. For example, the semiconductor substrate is of the P conductivity type and has a doping level of $10^{15}$ to $10^{18}$ atoms/cm$^3$.

On a top surface of the semiconductor substrate 11, a layer 12 of oxide is formed. The oxide layer 12, for example a silicon dioxide layer having preferably a thickness ranging from 50 to 200 Å, is conventionally formed by thermal growth or by chemical vapor deposition (CVD) and will form a gate oxide of the memory cells. As an alternative to silicon dioxide, other dielectric materials can be used, in particular dielectric materials having a dielectric constant higher than the silicon dioxide.

As schematically shown in FIG. 1B, dopant ions 13 are then implanted into the substrate 11 through the gate oxide layer 12. The implanted dopant ions are then made to diffuse through the substrate 11 by means of a thermal treatment, to form a doped layer 14 in correspondence of the top surface of the substrate 11. Alternatively, the dopant ions are implanted and simply activated, instead of being made to diffuse. The implanted ions are for example of a P type dopant, such as boron, and are implanted in a dose ranging from $1 \times 10^{12}$ to $5 \times 10^{13}$ ions/cm$^2$. The doped layer 14 has the function of setting the threshold voltage and controlling the punch-through of the memory cells to be formed independently of the doping level of the substrate 11.

Referring to FIG. 1C, a first layer 15 of polysilicon is then formed, for example by CVD, over the gate oxide layer 12. Preferably, the first polysilicon layer has a thickness ranging from 500 to 3000 Å. The first polysilicon layer can be doped to increase the conductivity thereof.

By means of a conventional photolithographic and etching process, the first polysilicon layer 15 and the underlying gate oxide layer 12 are selectively removed. As shown in FIG. 1D, stripes 16 of the first polysilicon layer 15 and of the gate oxide layer 12 extending orthogonally to the plane of the drawings are thus defined in the memory cell array region. Optionally, at least a shallow memory cell write enhancement implant is performed. P type dopant ions 17, for example of boron, are implanted in a dose ranging from $1 \times 10^{12}$ to $5 \times 10^{13}$ ions/cm$^2$. P type doped regions 18 with a different, in particular higher doping level than the P type doped layer 14 are thus formed in between the stripes 16. The doped regions 18, which may extend parallel to the stripes 16, increase the efficiency of the electron injection mechanism exploited for writing the memory cells, by improving the hot electron generation process, and thus increase the memory cells writing efficiency.

Figure 1E:
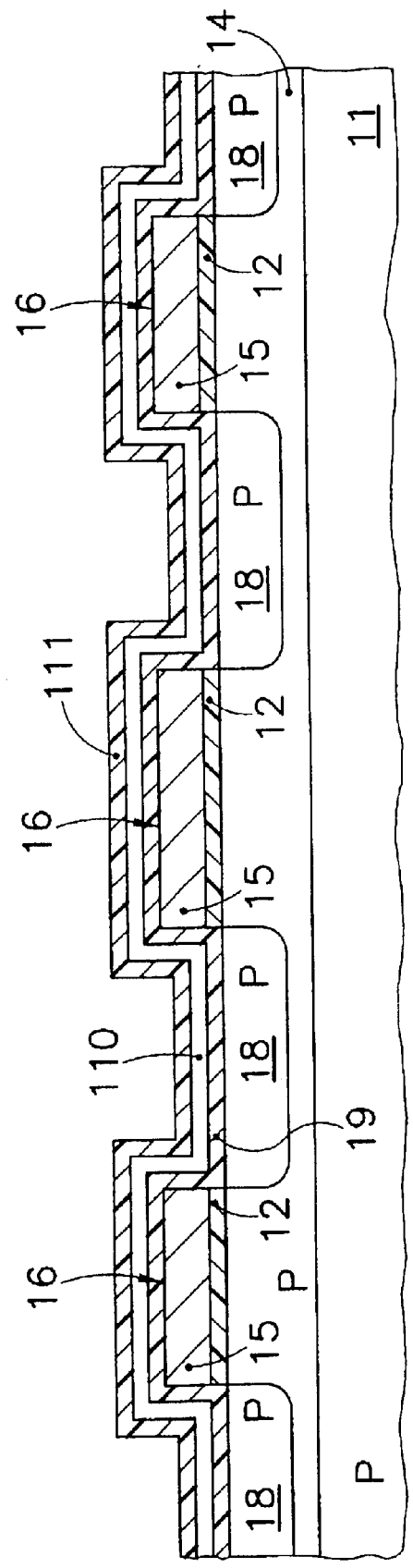

Referring now to FIG. 1E, a stack of three layers is formed over the top surface of the structure. The stack comprises a bottom layer 19 of oxide, an intermediate layer 110 of silicon nitride and a top layer 111 of oxide. The oxide-nitride-oxide or ONO stack can be formed by thermal growth or CVD, and preferably has an overall equivalent thickness ranging from 100 to 200 Å. For example, each one of the three layers 19, 110 and 111 has an equivalent thickness of 50 Å. From the nitride layer 110 the charge storage elements of the memory cells will be formed.

Figure 1F:
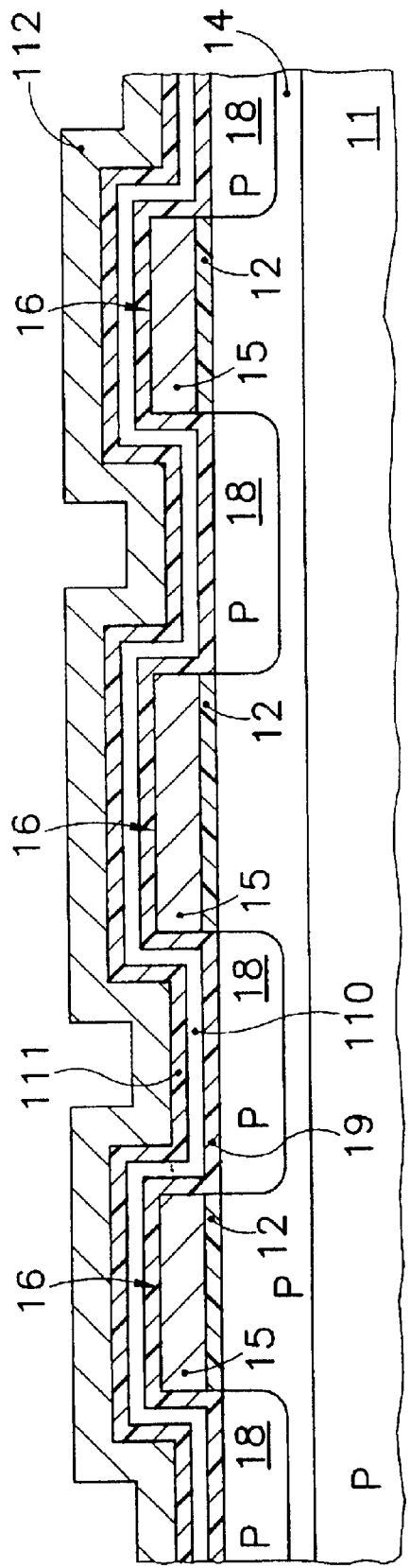

A second layer 112 of polysilicon is then formed, for example by deposition, over the ONO layer stack 19, 110, 111, as shown in FIG. 1F. The second polysilicon layer 112 has for example a thickness ranging from 300 to 1500 Å. The second polysilicon layer can be doped to increase the conductivity thereof.

Figure 1G:
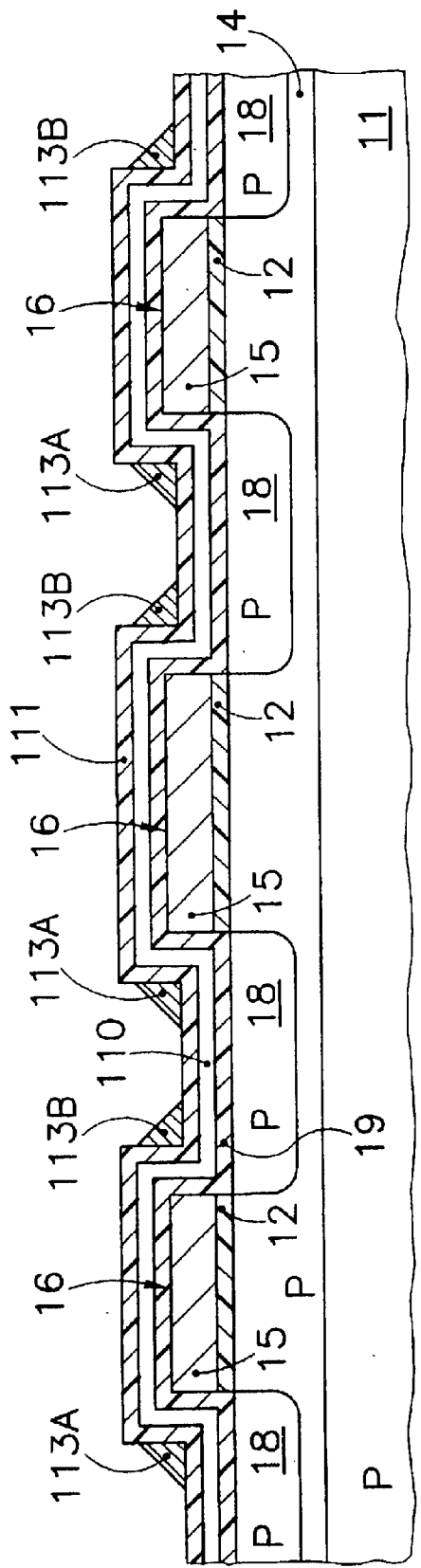

The second polysilicon layer 112 is then etched by means of an anisotropic plasma etch process, for example a Reactive Ion Etch (RIE). As shown in FIG. 1G, as a result of the etch process, polysilicon sidewall spacers 113A, 113B are left at the sides of the ONO stack 19, 110, 111 in correspondence of each stripe 16 of the first polysilicon layer 15 and gate oxide layer 12. The sidewall spacers will form lateral control gates of the memory cells.

Figure 1H:
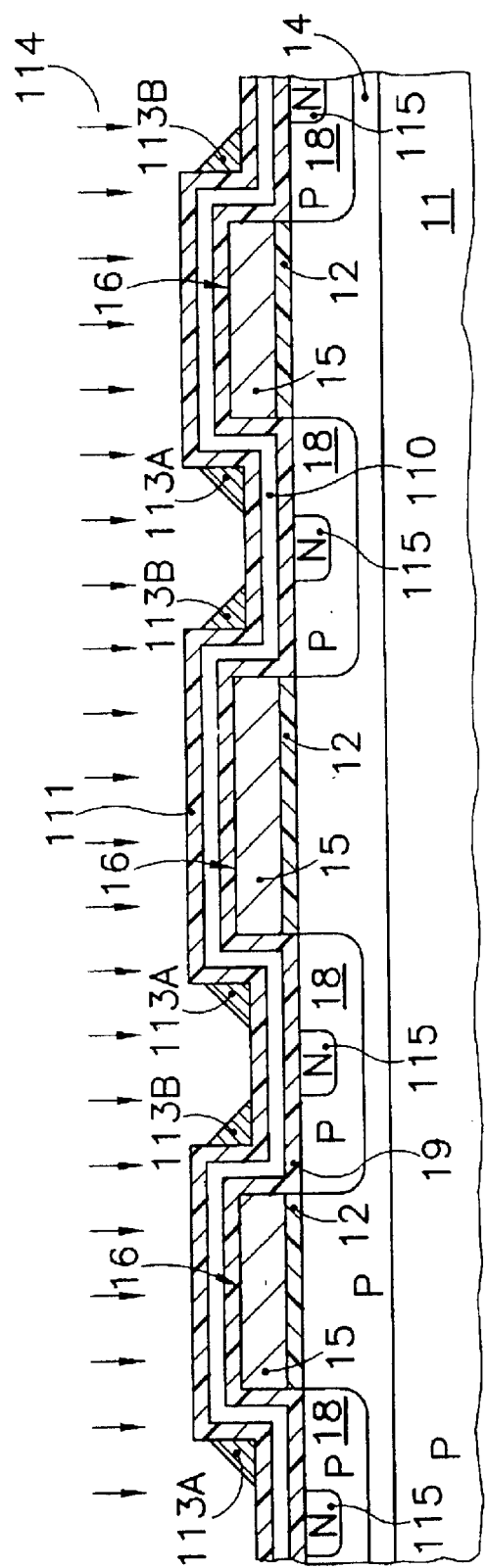

Then, as shown in FIG. 1H, N type dopant ions 114 are implanted and made to diffuse so as to form, inside the P type doped regions 18, bit line diffusions 115 extending parallel to the stripes 16. The bit line diffusions 115 will form the bit lines of the memory cell array, as well as source/drain regions for the memory cells. The dopant ions are for example of arsenic, and are implanted in a dose ranging from $1\times10^{15}$ to $5\times10^{15}$ ions/cm$^2$ at an energy suitable to obtain a shallow implant. Thanks to the presence of the sidewall spacers 113A, 113B, which mask the implant, the bit line diffusions 115 are self-aligned to the sidewall spacers and are spaced apart from the edges of the P type regions 18, i.e. from the edges of the stripes 16. Surface portions of the P type regions 18 from the edge thereof to the bit line diffusions 115 will form lateral channel portions of the memory cells, controlled by the lateral control gates.

Figure 1I:
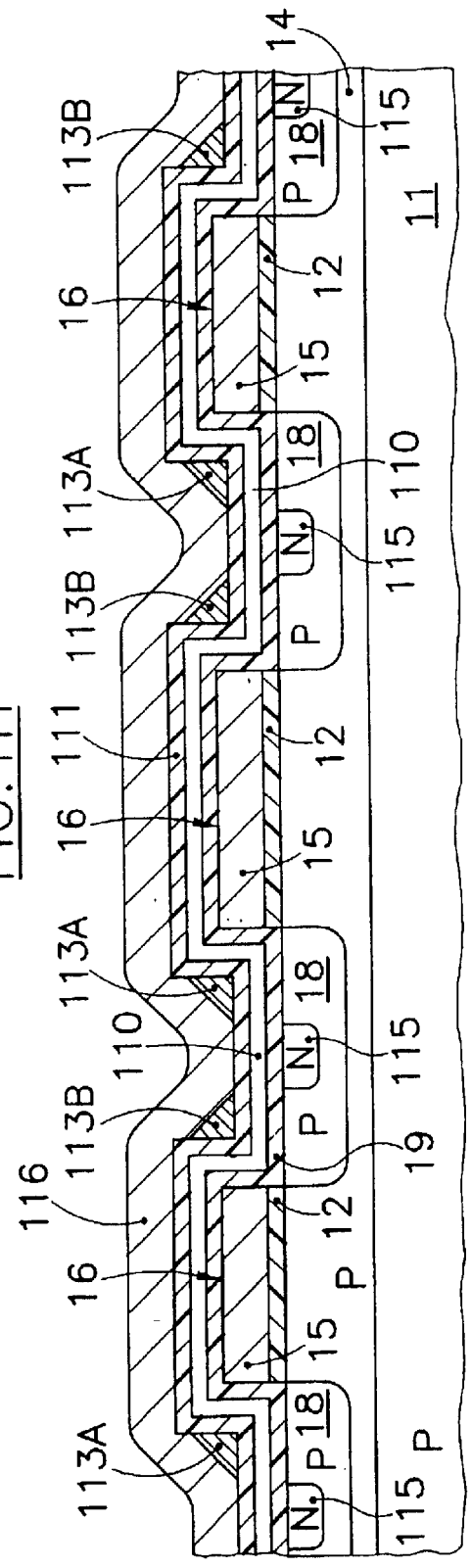
Figure 1J:
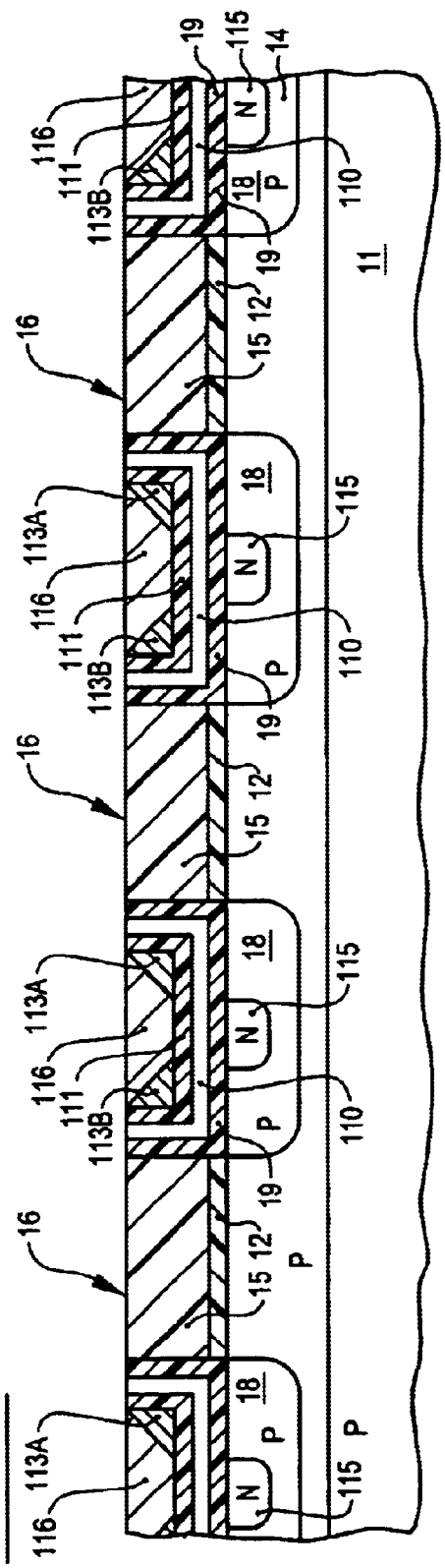
Figure 1K:
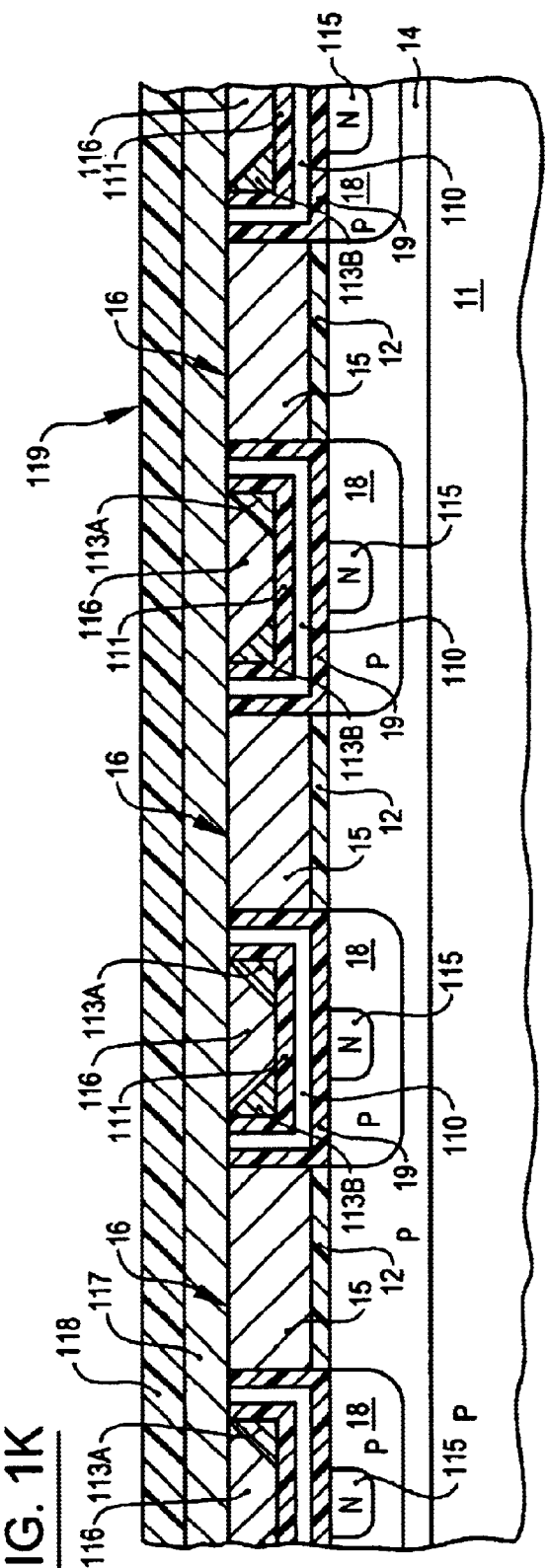

Referring to FIG. 1I, a third layer 116 of polysilicon, for example of thickness ranging from 1000 to 3000 Å, is formed over the top surface of the structure, for example by CVD. The third polysilicon layer can be doped to increase the conductivity thereof.

Figure 1L:
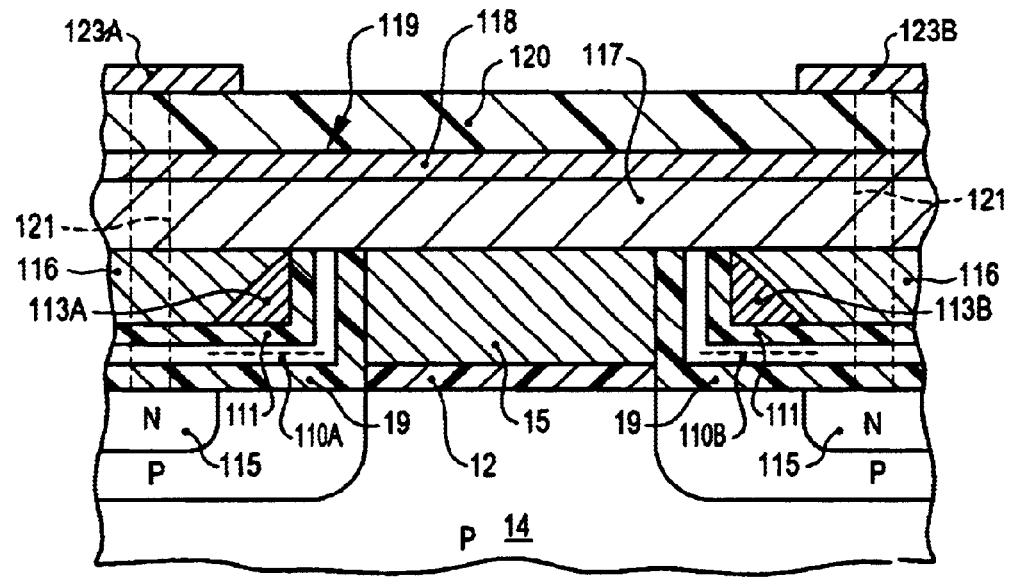

The third polysilicon layer 116 and the ONO stack 19, 110, 111 are then removed down to the first polysilicon layer 15, as depicted in FIG. 1L. Suitable removal techniques are for example a plasma etch process or a chemical-mechanical polishing (CMP) or a combination of these two processes. After this step, the top surface of the structure is substantially flat. In the regions between the stripes 16 the third polysilicon layer 116 fills the gaps existing between facing pairs of sidewall spacers 113A, 113B.

Figure 1M:
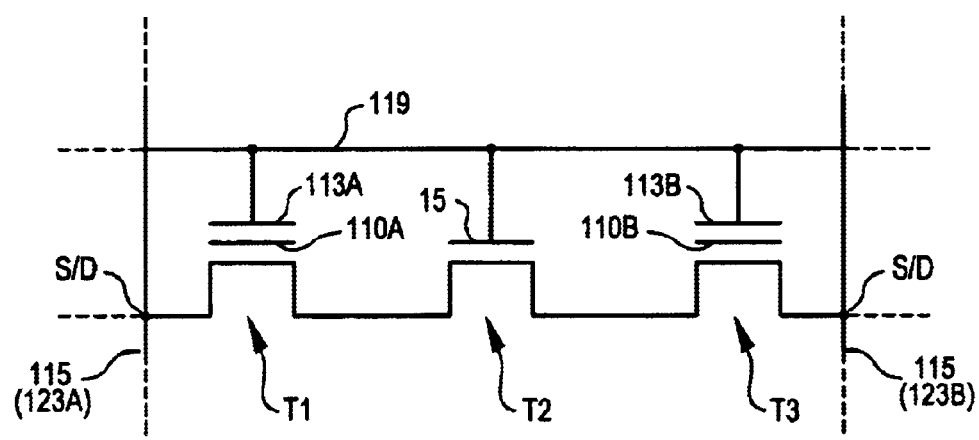

With reference to FIG. 1M, a fourth layer 117 of polysilicon, for example of thickness ranging from 1000 to 5000 Å, is formed over the top surface of the structure, for example by CVD. The fourth polysilicon layer can be doped to increase the conductivity thereof. Optionally, a silicide layer 118 can be formed at the top surface of the fourth polysilicon layer 117 to further increase the conductivity thereof. The silicide layer can be formed by conventional process steps, providing for depositing a layer of 200 to 2000 Å of a metal such as W or Ti capable of reacting with silicon, and performing a thermal treatment to make the metal react with the underlying polysilicon.

The fourth polysilicon layer 117 and, if present, the silicide layer 118 are then selectively removed by means of conventional photolithographic and etching techniques, to define stripes 119 transversal to the initially formed stripes 16 and to the bit line diffusions 115. The stripes 119 form word lines of the memory cell array. The stripes 16 of the first polysilicon layer 15, the portions of the third polysilicon layer 116, the spacers 113A, 113B and the ONO stack 19, 110, 111 are also selectively etched to remove all these layers in the regions between the word lines. Preferably, after this step a P type dopant such as boron is implanted in a dose ranging for example from $1\times10^{12}$ to $5\times10^{13}$ ions/cm$^2$ and then made to diffuse into the doped layer 14 for purposes of electrical isolation between the bit lines, in particular to prevent punch-through from occurring.

Figure 1N:
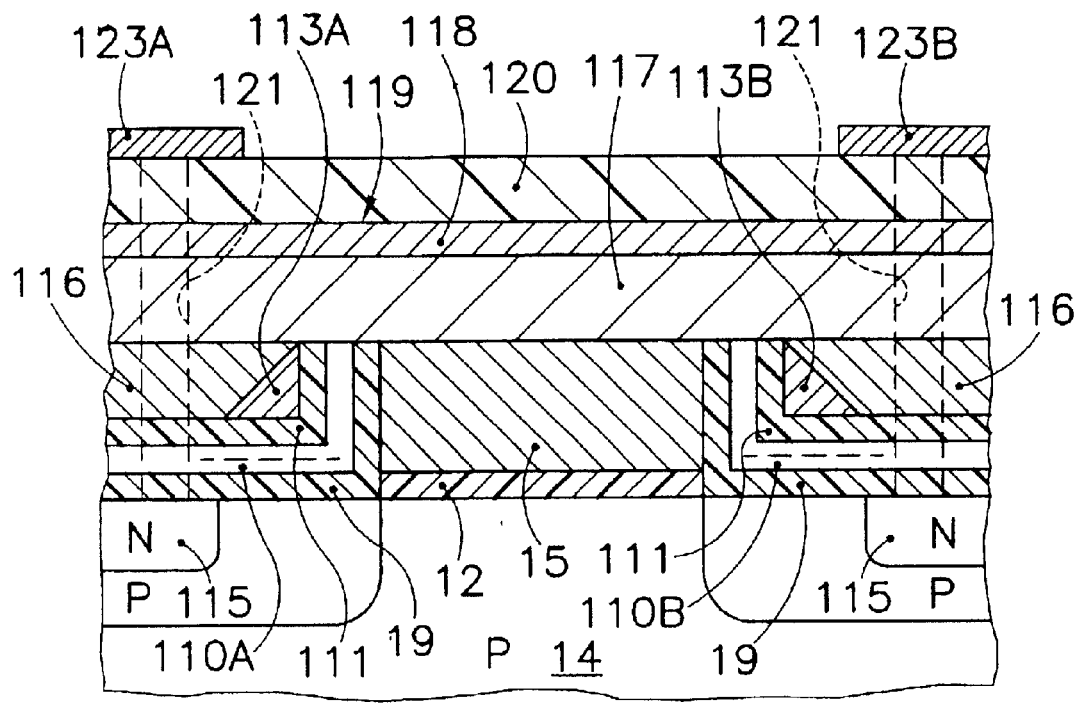
FIG. 1N is an enlarged cross-sectional view of a dual charge storage location memory cell obtained by the process according to the first embodiment of the invention.

Referring to FIG. 1N, a conventional dielectric stack 120 with good ionic gettering properties is then placed over the top surface of the structure. Preferably, the memory cell array is of the so-called contact-less type. Memory cell arrays of this type are typically made up of a plurality of sub-arrays or blocks of memory cells (extending for example for 32, 64 or 128 word lines) free of contacts to the memory cells source/drain region. Contact openings 121 are formed in the dielectric layer 120 down to the surface of the bit line diffusions 115 in prescribed areas externally to the memory cells sub-arrays. By means of conventional contact formation and metallization techniques metal bit lines 123A, 123B are then defined running transversally to the word lines 119 over the bit line diffusions 115, contacting the latter in correspondence of such prescribed areas. The metal bit lines, which can have alternative arrangements to the one shown, limit voltage drops along the bit line diffusions 115.

Figure 1P:
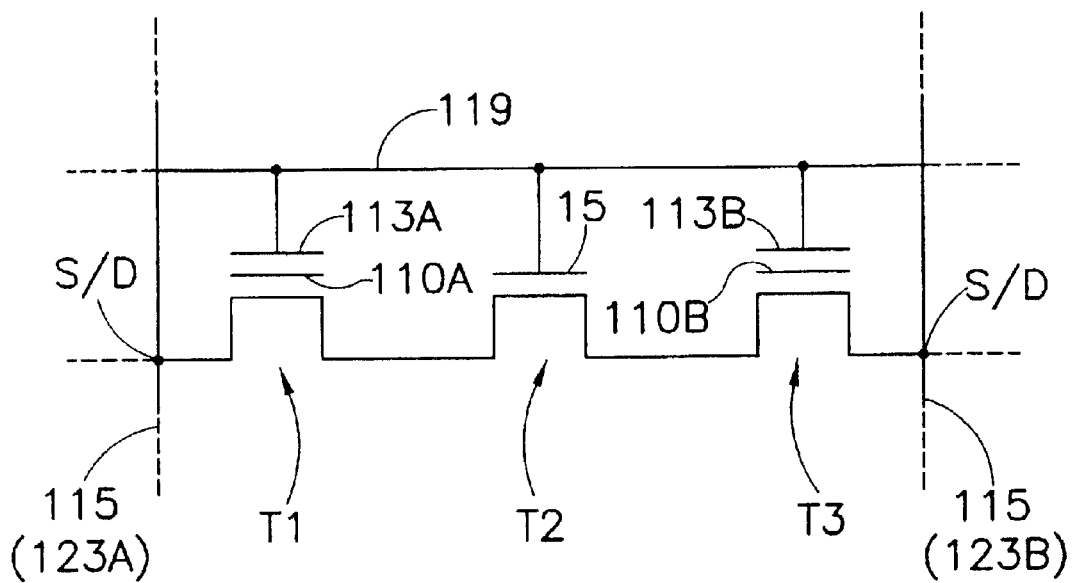
FIG. 1P is an electrical equivalent diagram of the memory cell of FIG. 1N.

FIG. 1P is an electric equivalent diagram of the memory cell shown in FIG. 1N. The memory cell is equivalent to three MOS transistors T1, T2, T3 connected in series between the left-hand bit line 123A and the right-hand bit line 123B. The lateral transistors T1 and T3 have each a control gate, formed by the polysilicon sidewall spacers 113A, 113B, respectively, and a charge storage element formed by the portion 110A, 110B of the ONO stack nitride layer 110 under the respective sidewall spacer. The central transistor T2 is a normal MOSFET, having a gate formed by the first polysilicon layer 15 and a channel formed by the portion of the doped layer 14 under the gate oxide 12. The gate of transistor T2 and the control gates of transistors T1 and T3 are all connected to the word line 119. In particular, the portions of the third polysilicon layer 116 which fill the gaps between facing pairs of sidewall spacers assure the electrical contact between the polysilicon sidewall spacers 113A, 113B and the gate of transistors T2 through the word line 119.

By applying suitable voltages to the word line 119 and to the bit lines 123A, 123B (and thus to the bit line diffusions 115), electrons can be selectively injected into either one or both of the nitride layer portions 110A, 110B. Each one of the two lateral transistors T1 and T3 can store different levels of charge, so as to combine the advantages of a dual charge storage location memory cell with those of a multilevel memory cell.

For reading the information stored in the memory cell, the two memory cell source/drain doped regions formed by the two bit line diffusions 115 act as interchangeable source/drain regions S/D of the memory cell. Specifically, if it is desired to read the bit stored in transistor T1, the bit line diffusion 115 adjacent thereto behaves as a source, while the opposite bit line diffusion 115 acts as a drain. Bit line 123A is biased to ground while bit line 123B is biased to, for example, 2 V. The word line 119 is conventionally biased to the supply voltage VDD of the memory device (for example, approximately 3 V). Due to short-channel effects taking place in transistor T3, the presence of a charge in the right-hand portion 110B of the nitride layer 110 does not influence the conductivity of transistor T3. A current or no current will flow from the bit line 123B to the bit line 123A only in consequence of the absence or presence of a charge in the left-hand portion 110A of the nitride layer 110. The information stored in transistor T3 can be read by reversing the above conditions.

In the process according to the first embodiment of the invention, four layers of polysilicon are used.

FIGS. 2A to 2H schematically show the main steps of a process according to a second embodiment of the invention, which requires one less layer of polysilicon.

Similarly to the previously described embodiment, the process according to this second embodiment provides for forming on the substrate 11 the gate oxide layer 12 (FIG. 1A), implanting and diffusing dopant ions to form the doped layer 14 for setting the memory cells threshold voltage (FIG. 1B) and forming over the substrate top surface the first polysilicon layer 15 (FIG. 1C).

Referring to FIG. 2A, by means of a conventional photolithographic and etching process, the first polysilicon layer 15 is selectively removed. Stripes 26 of the first polysilicon layer 15 extending orthogonally to the plane of the drawings are thus defined. Optionally, a write enhancement implant is performed. P type dopant ions 27 are implanted and made to diffuse into the substrate 11 where the latter is not covered by the first polysilicon layer stripes 26. Doped regions 28 of the P conductivity type with a higher doping level than the P type doped layer 14 are thus formed in between the stripes 26. The doped regions 28 may extend parallel to the stripes 26. The dopants, implant doses and energies can for example be the same as those previously specified in connection with the first embodiment.

With reference to FIG. 2B, a layer 21 of oxide, for example silicon dioxide, is formed over the top surface of the structure. The oxide layer 21, which preferably has a thickness ranging from 100 to 500 Å, can be formed by CVD and has the function of etch stopper for a following etch process. Over the oxide layer 21 a layer 22 of silicon nitride is formed, for example by CVD. The nitride layer 22 preferably has a thickness ranging from 200 to 1000 Å.

As schematically shown in FIG. 2C, N type dopant ions 214 are then implanted and made to diffuse so as to form, inside the doped regions 28, N type bit line diffusions 215 extending parallel to the stripes 26. The dopant ions and the implant dose are for example the same as those specified for the first embodiment, while a higher implant energy is used, in order to let the ions penetrate a thicker layer.

The nitride layer 22 acts as an implant mask for the implanted ions. The bit line diffusions 215 are thus spaced apart from the edges of the P type doped regions 28, i.e. from the edges of the polysilicon stripes 26. The surface portions of the P type regions 18 from the edge thereof to the bit line diffusions 215 will form lateral channel portions of the memory cells.

Afterwards, as shown in FIG. 2D, the nitride layer 22, the oxide layer 21 and, where not covered by the polysilicon stripes 26, the gate oxide layer 12 are removed by means of an etch process, down to the polysilicon layer 15 and the substrate top surface, where the latter is not covered by the polysilicon stripes 26. The gate oxide layer 12 remains only under the polysilicon stripes 26.

Referring now to FIG. 2E, a stack of three layers is formed over the top surface of the structure. The stack comprises a bottom layer 29 of oxide, an intermediate layer 210 of silicon nitride and a top layer 211 of oxide. The oxide-nitride-oxide or ONO layer stack can for example have the same characteristics as the ONO stack 19, 110, 111 of the previously described embodiment, and be formed in the same way. The nitride layer 210 will form the charge retention elements of the memory cells.

As shown in FIG. 2F, a second layer 212 of polysilicon is then formed, for example by CVD, over the ONO stack 29, 210, 211. The second polysilicon layer 212 has for example a thickness ranging from 500 to 4000 Å. Dopants can be added to the second polysilicon layer to increase the conductivity thereof.

The second polysilicon layer 212 and the ONO stack 29, 210, 211 are then removed down to the polysilicon stripes 26, for example by means of a plasma etch or by CMP or a combination of these two processes. As shown in FIG. 2G, as a result of this step, the polysilicon stripes 26 are left uncovered, and the space between the stripes 26 is filled by portions of the second polysilicon layer 212. The top surface of the structure is substantially flat.

With reference to FIG. 2H, a third layer 216 of polysilicon, for example of thickness ranging from 500 to 2000 Å, is formed over the top surface of the structure. Dopants can be added to the third polysilicon layer to increase the conductivity thereof. Optionally, a silicide layer 218 can be formed on the top surface of the third polysilicon layer 216 to further increase the conductivity thereof.

The third polysilicon layer 216 and, if present, the suicide layer 218 are then selectively removed by means of conventional photolithographic and etching techniques, to define stripes 219 transversal to the stripes 26. The stripes 219 form word lines of the memory cell array. The stripes 26 of the first polysilicon layer 15, the portions of the second polysilicon layer 212 and the ONO stack 29, 210, 211 are also selectively etched to remove all these layers in the regions between the word lines. Preferably, after this step a P type dopant such as boron is implanted and made to diffuse into the doped layer 14 for purposes of electrical isolation between the bit lines, in particular to prevent punch-through from occurring.

Figure 2I:
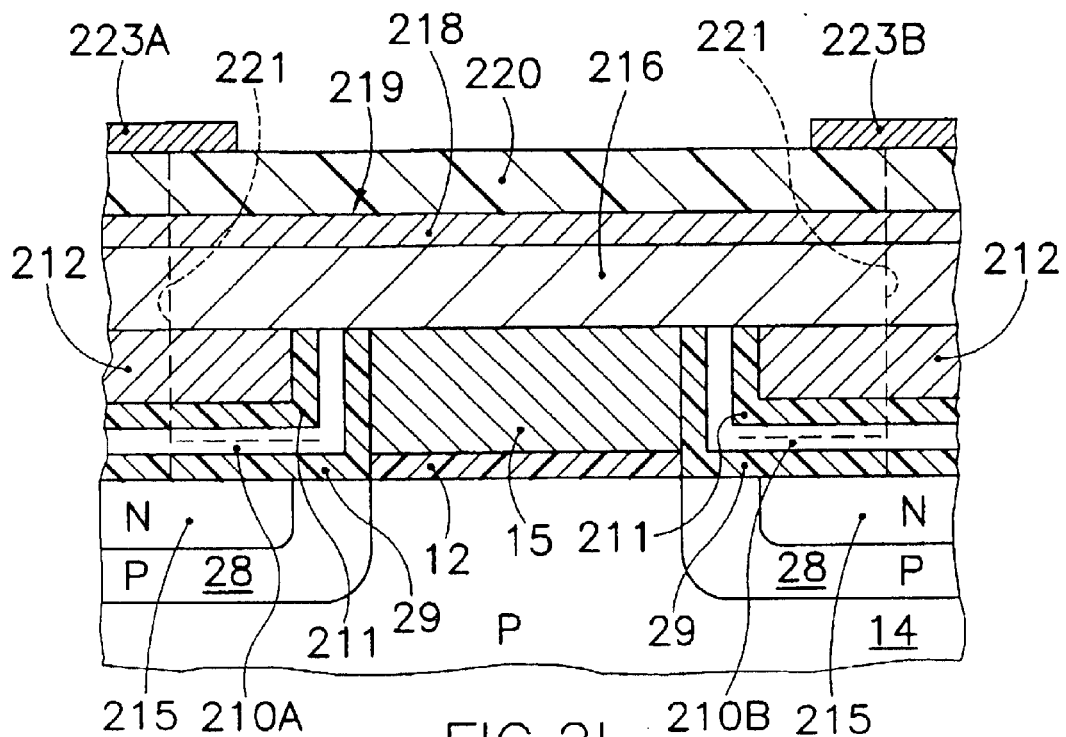
FIG. 2I is an enlarged cross-sectional view of a dual charge storage location memory cell obtained by the process according to the second embodiment of the invention.

Referring to FIG. 2I, a conventional dielectric stack 220 with good ionic gettering properties is then placed over the top surface of the structure. As in the previous embodiment, contact openings 221 are formed in the dielectric layer 220 down to the surface of the bit line diffusions 215 in prescribed areas externally to memory cell sub-arrays. By means of conventional contact formation and metallization techniques, metal bit lines 223A, 223B are defined running transversally to the word lines 219 over the bit line diffusions 215, contacting the latter in correspondence of said prescribed areas. As for the first embodiment, other arrangements of the metal bit lines are possible.

The memory cell obtained by the process according to the second embodiment of the invention is functionally identical to that depicted in FIG. 1N, and can be electrically described by means of the same equivalent diagram of FIG. 1P. However, from a structural viewpoint this memory cell differs from the one previously described, since it does not have sidewall control gates formed by polysilicon sidewall spacers. The portions of the second polysilicon layer 212 filling the spaces between the first polysilicon layer 15 act as the control gate of transistors T1 and T2. The portions 210A, 210B of the ONO stack nitride layer 210 are the memory cell charge storage elements.

FIGS. 3A to 3G schematically show the main steps of a process according to a third embodiment of the invention which, as the second embodiment, requires only three layers of polysilicon. Similarly to the first described embodiment, the process according to this third embodiment provides for forming on the substrate 11 the gate oxide layer 12 (FIG. 1A), implanting and diffusing dopant ions to form the doped layer 14 for setting the memory cells threshold voltage (FIG. 1B), forming over the substrate top surface the first polysilicon layer 15 (FIG. 1C), etching the first polysilicon layer 15 and the gate oxide 12 to form stripes 16 and optionally performing the write enhancement implant to form the doped regions 18 (FIG. 1D), and forming the ONO stack 19, 110, 111 over the top surface of the structure.

Figure 3H:
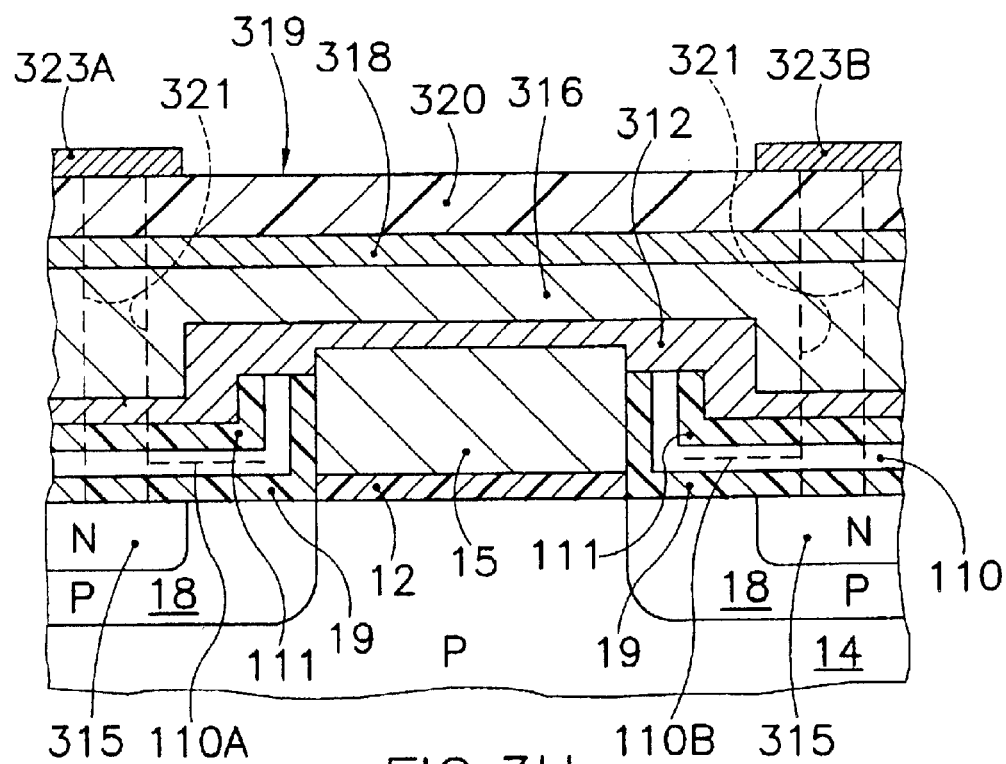
FIG. 3H is an enlarged cross-sectional view of a dual charge storage location memory cell obtained by the process according to the third embodiment of the invention.
Figure 3A:
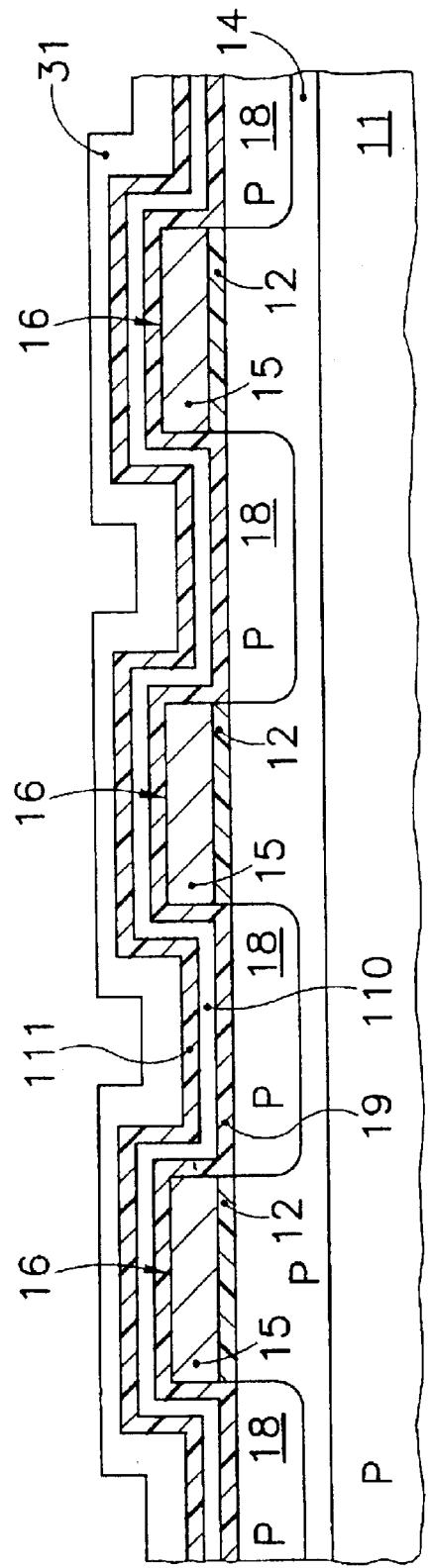
FIGS. 3A to 3G are cross-sectional views showing some steps of a manufacturing process according to a third embodiment of the present invention.

Referring now to FIG. 3A, a material in the liquid phase is then deposited by spinning the substrate 11 over the top surface of the structure. The liquid-phase material is then made denser. Suitable liquid materials are for example an organic bottom anti-reflecting coating (BARC) and a spin on glass (SOG). A film 31 is thus formed which at least partially fills the recesses in the structure top surface, in particular filling the spaces between the polysilicon stripes 16. The ONO stack over the polysilicon stripes 16 is substantially left uncovered by the film 31.

Figure 3B:
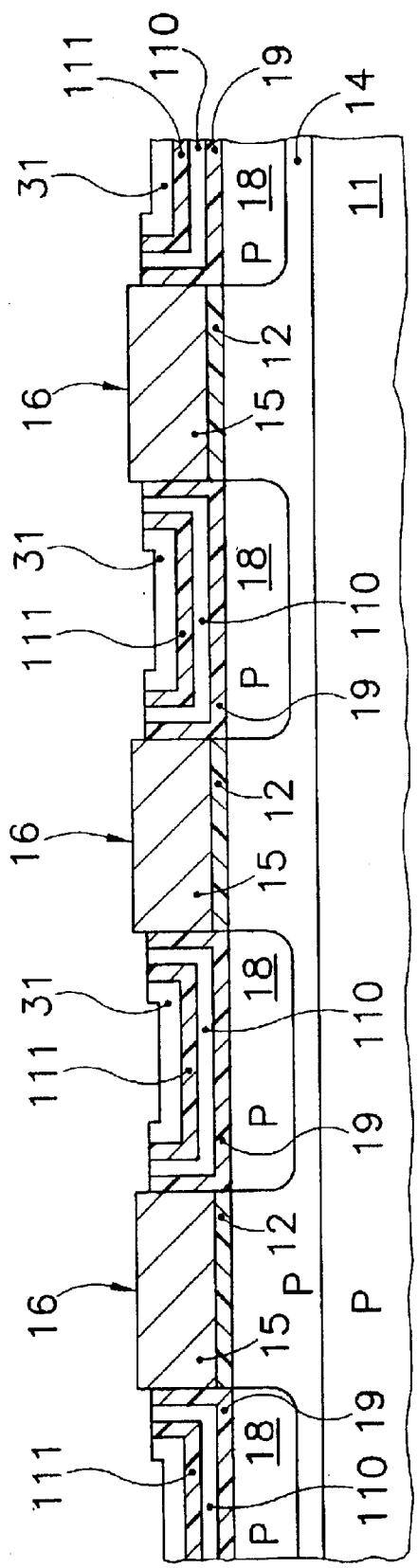
Figure 3C:
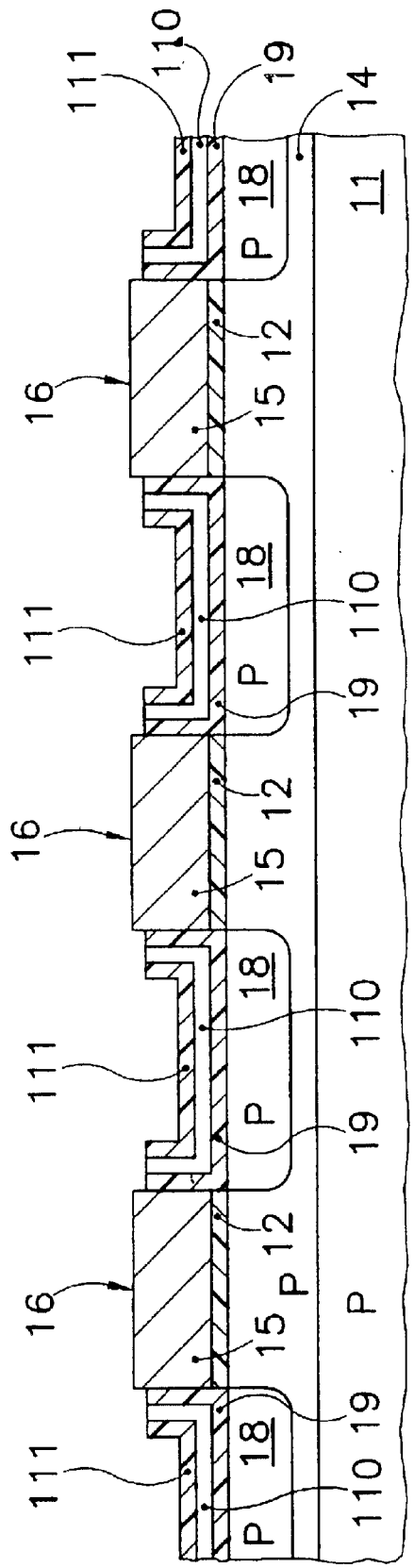

As shown in FIG. 3B, the film 31 and the ONO stack 19, 110, 111 are then removed by etching from over the polysilicon stripes 16. Preferably, the etching is a plasma RIE. The presence of the film 31 in the spaces between the polysilicon stripes 16 protects from the etching agents the underlying ONO stack, preventing the removal thereof. The remaining portions of the film 31 are then removed, to obtain the structure shown in FIG. 3C.

Figure 3D:
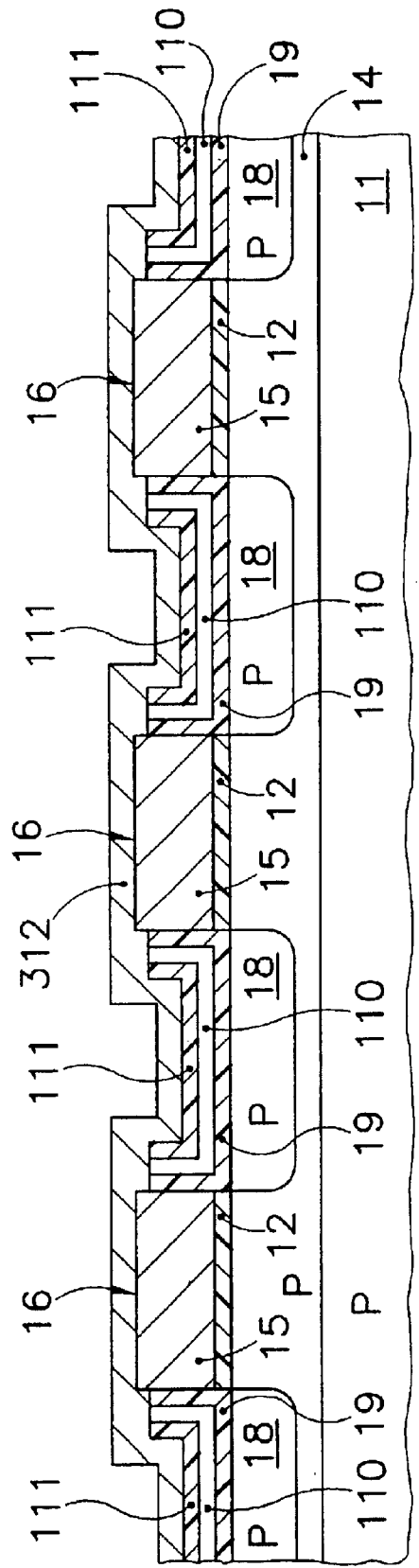

With reference to FIG. 3D, a second layer 312 of polysilicon is then formed over the top surface of the structure. The second polysilicon layer 322 can be formed by deposition, and preferably has a thickness ranging from 200 to 1000 Å. Dopants can be added to the second polysilicon layer to increase the conductivity thereof.

Figure 3E:
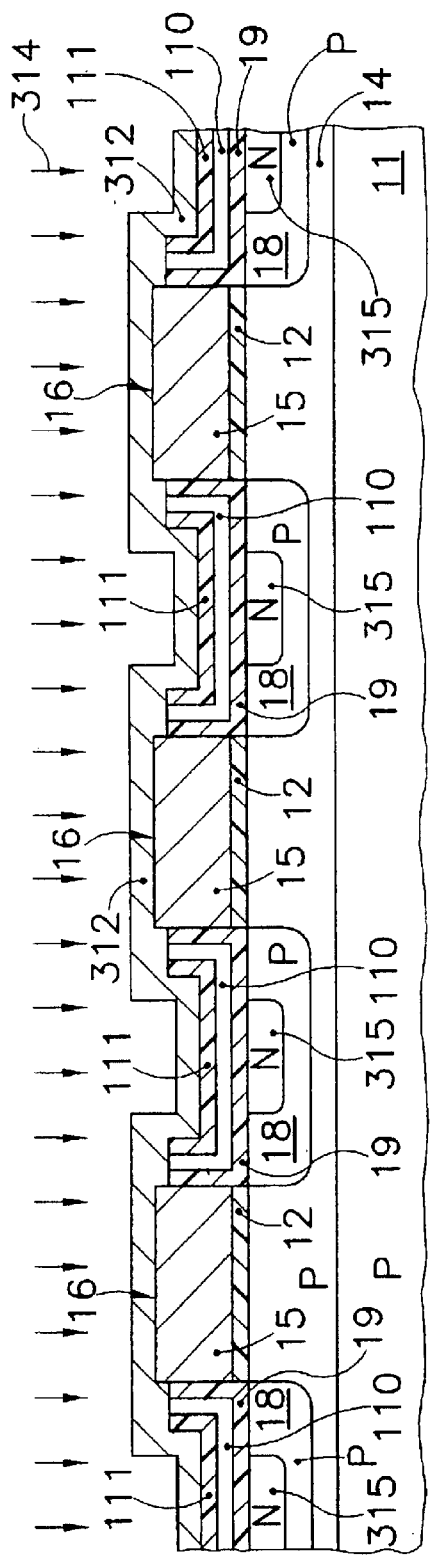

As shown schematically in FIG. 3E, N type dopant ions 314 are then implanted and made to diffuse into the doped regions 18 to form bit line diffusions 315 extending parallel to the polysilicon stripes 16. The dopant ions and the implant dose and energy can be for example the same as those specified in connection with the first described embodiment. The second polysilicon layer acts as an implant mask. The bit line diffusions 315 are spaced apart from the edges of the P type regions 18. Surface portions of the P type regions 18 from the edge thereof to the bit line diffusions will form lateral channel portions of the memory cells.

Figure 3F:
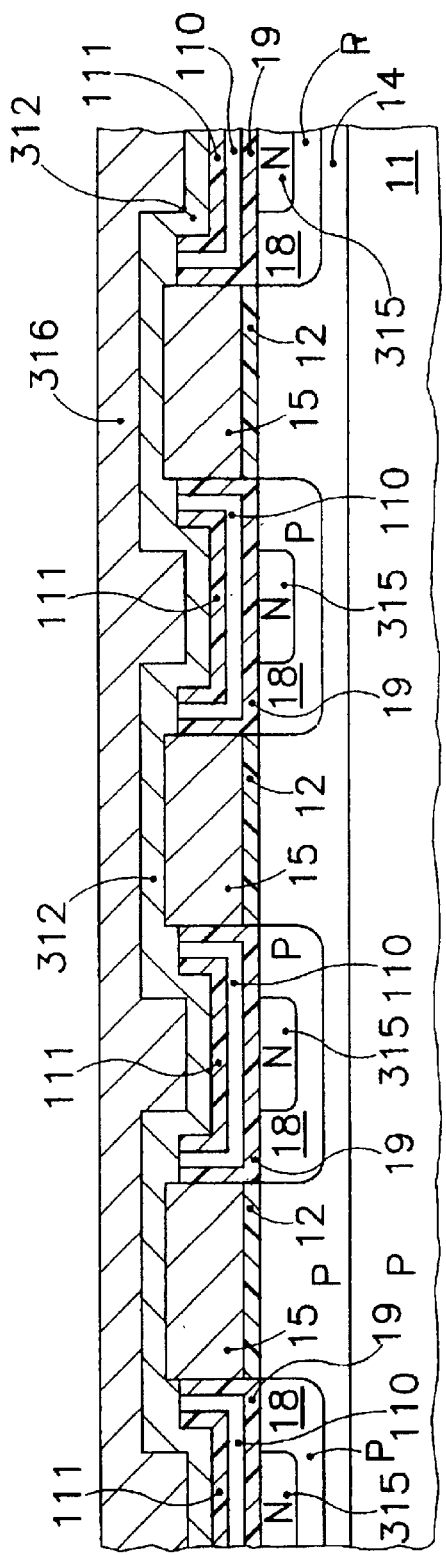

Referring to FIG. 3F, a third layer 316 of polysilicon, for example having a thickness ranging from 200 to 1000 Å, is then formed on the structure top surface. The third polysilicon layer 316 fills the recesses in the top surface of the structure, in particular the recesses in the second polysilicon layer 312. Dopants can be added to the third polysilicon layer 316 to increase the conductivity thereof. If desired, the third polysilicon layer 316 can be planarized, using conventional planarization techniques.

Figure 3G:
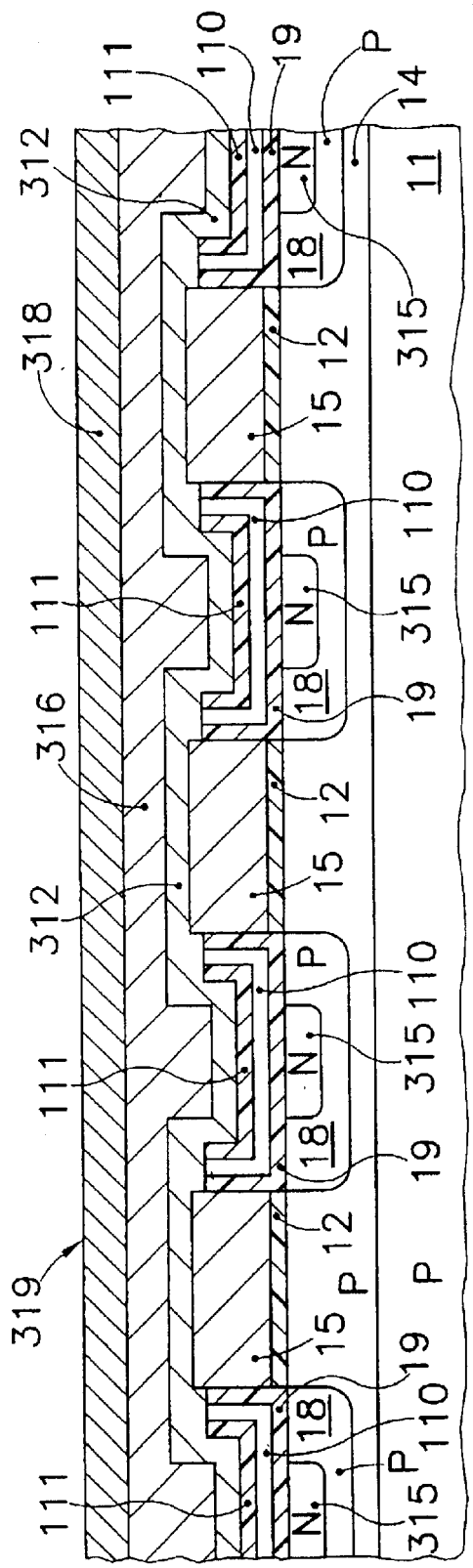

Optionally, as shown in FIG. 3G, a layer 318 of silicide is formed on the top surface of the third polysilicon layer 316, to further increase the conductivity thereof. The silicide layer 318, the third polysilicon layer 316, the second polysilicon layer 122 are selectively removed to define stripes 319 extending transversally to the bit line diffusions 315. The stripes 319 form word lines of the memory cell array. The stripes 16 of the first polysilicon layer 15, the portions of the third polysilicon layer 116 and the ONO stack 19, 110. 111 are also selectively etched to remove all these layers in the regions between the word lines. Preferably, after this step a P type dopant such as boron is implanted and made to diffuse into the doped layer 14 for purposes of electrical isolation between the bit lines, in particular to prevent punch-through from occurring.

Referring to FIG. 3H, a conventional dielectric stack 320 with good ionic gettering properties is then placed over the top surface of the structure. As in the previous two embodiments, contact openings or vias 321 are formed in the dielectric layer 320 down to the surface of the bit line diffusions 315 in prescribed areas outside memory cells sub-arrays. By means of conventional contact formation and metallization techniques, metal bit lines 323A, 323B are defined running transversally to the word lines 319 over the bit line diffusions, contacting the latter in correspondence of such prescribed areas. Once again, other arrangements for the metal bit lines are possible.

The memory cell obtained by the process according to the third embodiment of the invention is functionally identical to the ones depicted in FIGS. 1N and 2I, and can be electrically described by means of the same equivalent diagram of FIG. 1P. However, from a structural viewpoint this memory cell differs from the one obtained by the process according to the first embodiment, since it does not have sidewall control gates formed by polysilicon spacers. The portions of the second polysilicon layer 312 filling the spaces between the first polysilicon layer 15 act as the control gates of transistors T1 and T2. The portions 110A, 110B of the ONO stack nitride layer 110 are the memory cell charge storage elements.

FIGS. 4A to 4D schematically show the main steps of a process according to a fourth embodiment of the present invention. As for the second and third embodiments, this process requires only three layers of polysilicon.

Similarly to the first described embodiment, the process according to this fourth embodiment provides for forming on the substrate 11 the gate oxide layer 12 (FIG. 1A), implanting and diffusing dopant ions to form the doped layer 14 for setting the memory cells threshold voltage (FIG. 1B), forming over the substrate top surface the first polysilicon layer 15 (FIG. 1C), etching the first polysilicon layer 15 and the gate oxide 12 to form stripes 16 and optionally performing the write enhancement implant to form the doped regions 18 (FIG. 1D), forming the ONO stack 19, 110, 111 over the top surface of the structure, depositing the second polysilicon layer 112 (FIG. 1F) on the structure top surface and defining the polysilicon sidewall spacers 113A, 113B by means of an anisotropic etching of the second polysilicon layer 112.

Figure 4A:
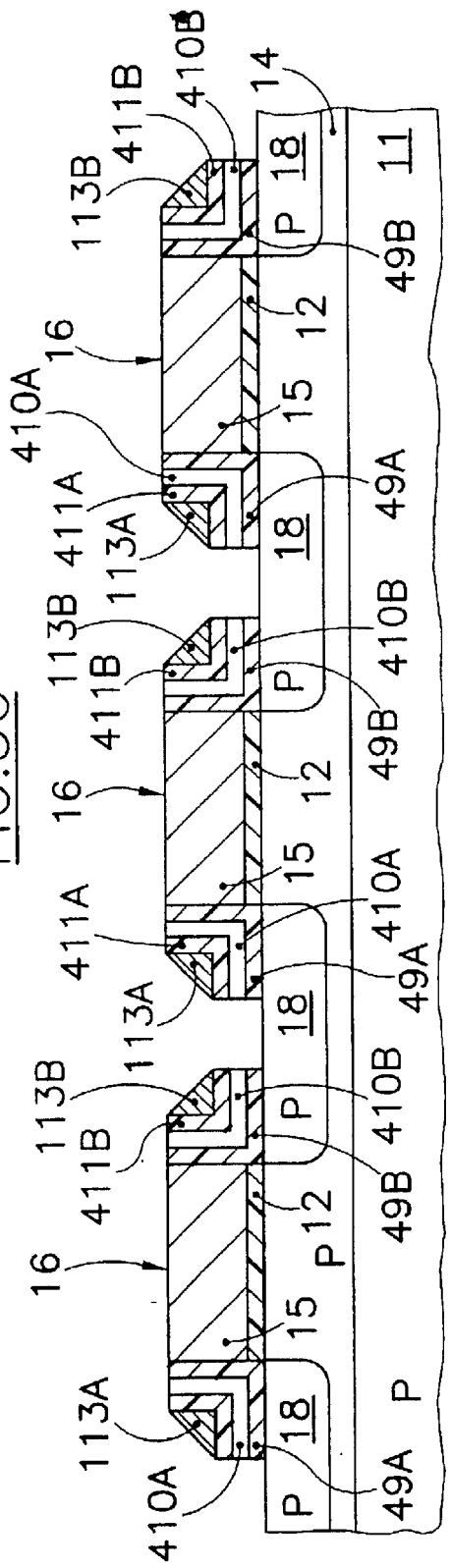

Referring now to FIG. 4A, an etch process is performed to remove the previously formed ONO stack from over the polysilicon stripes 16 and in the exposed ONO stack portions in between the spacers 113A, 113B. "L"-shaped ONO stack portions 49A, 410A, 411A and 49B, 410B, 411B, covered by the spacers 113A and 113B, are thus left at the two sides of each stripe 16. Differently from the previous embodiments, which also provides for forming "L"-shaped ONO stack portions at the sides of the stripes 16, the "L"-shaped ONO stack portions at the sides of a generic stripe 16 are in this case physically separated from the "L"-shaped ONO stack portions at the sides of an adjacent stripe 16.

As schematically depicted in FIG. 4B, an N type dopant is then selectively implanted and made to diffuse into the P type doped regions 18 to form N type bit line diffusions 415 extending parallel to the stripes 16. The dopant ions and the implant dose can for example be the same as the exemplary ones specified previously in connection with the first embodiment. The implant energy can be lower since the dopant ions do not have to pass through the ONO stack. Alternatively, this implant can be performed prior to the etching of the ONO stack, in which case same implant energies as those previously mentioned can be used. Optionally, a silicide layer (not shown in the drawings) is formed in self-aligned manner over the bit line diffusions 415, to reduce the resistance thereof.

With reference to FIG. 4C, a layer 41 of a dielectric material is then formed on the structure top surface. The dielectric layer, which can be for example a layer of TEOS with a thickness ranging from 1000 to 7000 Å, has the main function of making the structure top surface substantially flat.

Figure 4D:
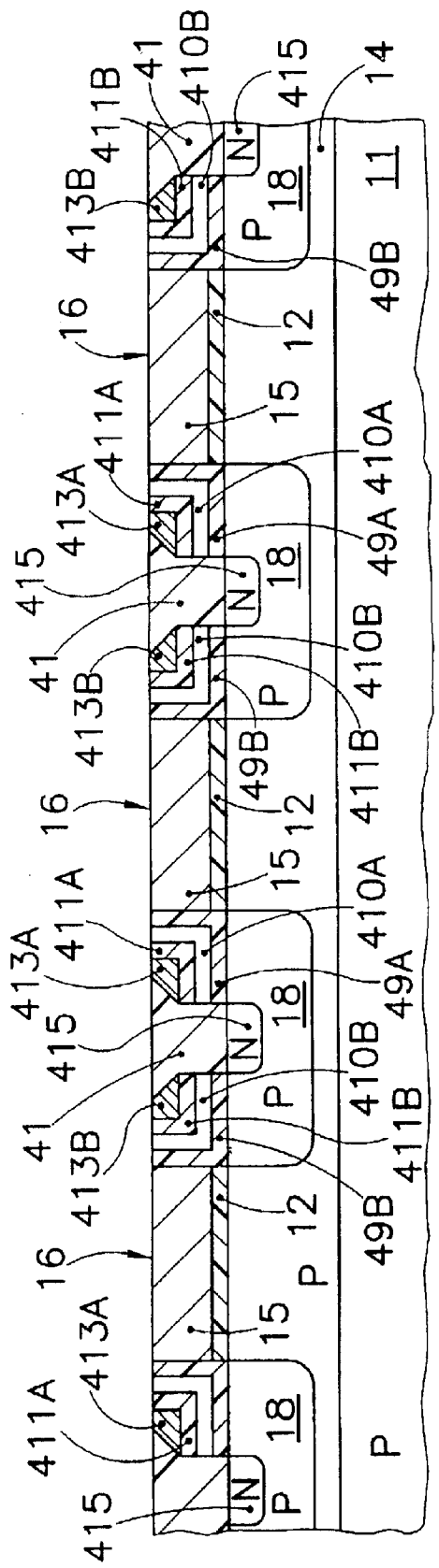

The dielectric layer 41 is then removed non-selectively by means of a plasma etching or a CMP or a combination of these two processes down to the polysilicon stripes 16. During the removal process, also the upper part of the polysilicon stripes 16, of the "L"-shaped ONO portions 49A, 410A, 411A, and 49B, 410B, 411B and of the sidewall spacers 113A, 113B are removed. The resulting structure is schematically depicted in FIG. 4D. Trapezoidal sidewall spacers 413A, 413B are thus obtained, having a flat top surface. The spaces between the spacers 413A, 413B remains filled with portions of the dielectric layer 41. The structure top surface is substantially flat.

Figure 4E:
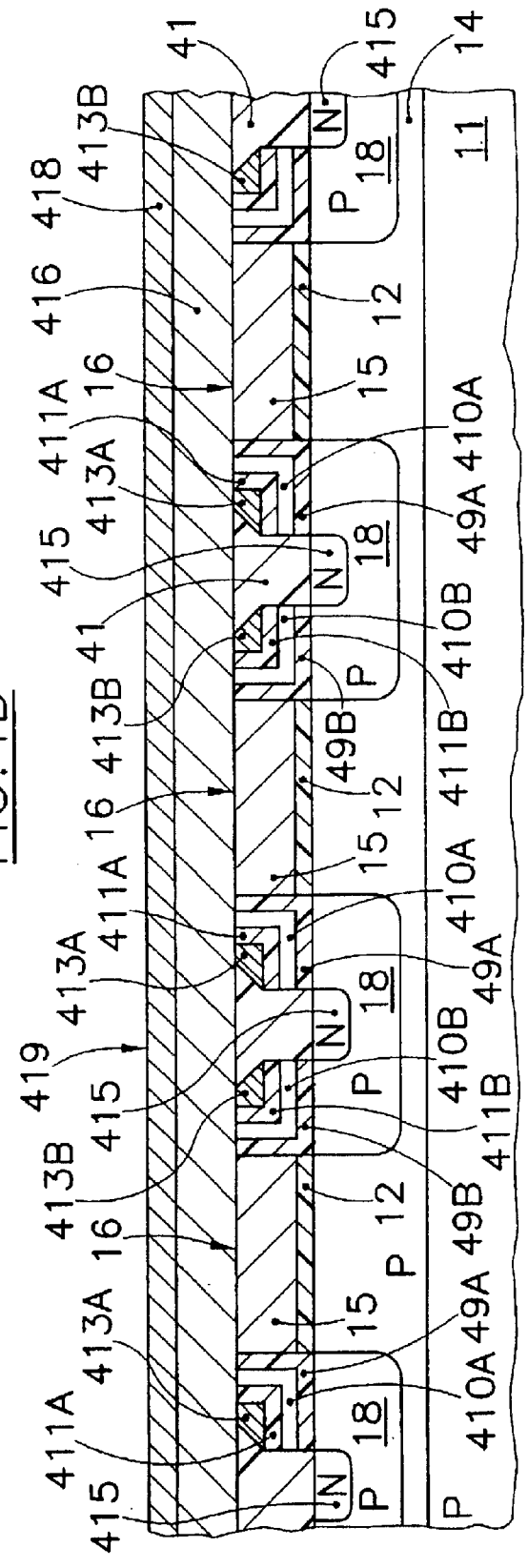

With reference to FIG. 4E, a third layer 416 of polysilicon is formed on the structure top surface, for example by CVD. The third polysilicon layer has for example a thickness ranging from 1000 to 5000 Å. The third polysilicon layer can be doped to increase the conductivity thereof. Optionally, a silicide layer 418 is formed on top of the polysilicon layer 416, to further increase the conductivity thereof.

The silicide layer 418 and the third polysilicon layer 416 are selectively removed to define stripes 419 extending transversally to the bit line diffusions 415. The stripes 419 form word lines of the memory cell array. The stripes 16 of the first polysilicon layer 15, the portions of the dielectric layer 41, the sidewall spacers 413A, 413B and the "L"-shaped portions of ONO stack are also selectively etched to remove all these layers in the regions between the word lines 419. Preferably, after this step a P type dopant such as boron is implanted and made to diffuse into the doped layer 14 for purposes of electrical isolation between the bit lines, in particular to prevent punch-through from occurring.

Figure 4F:
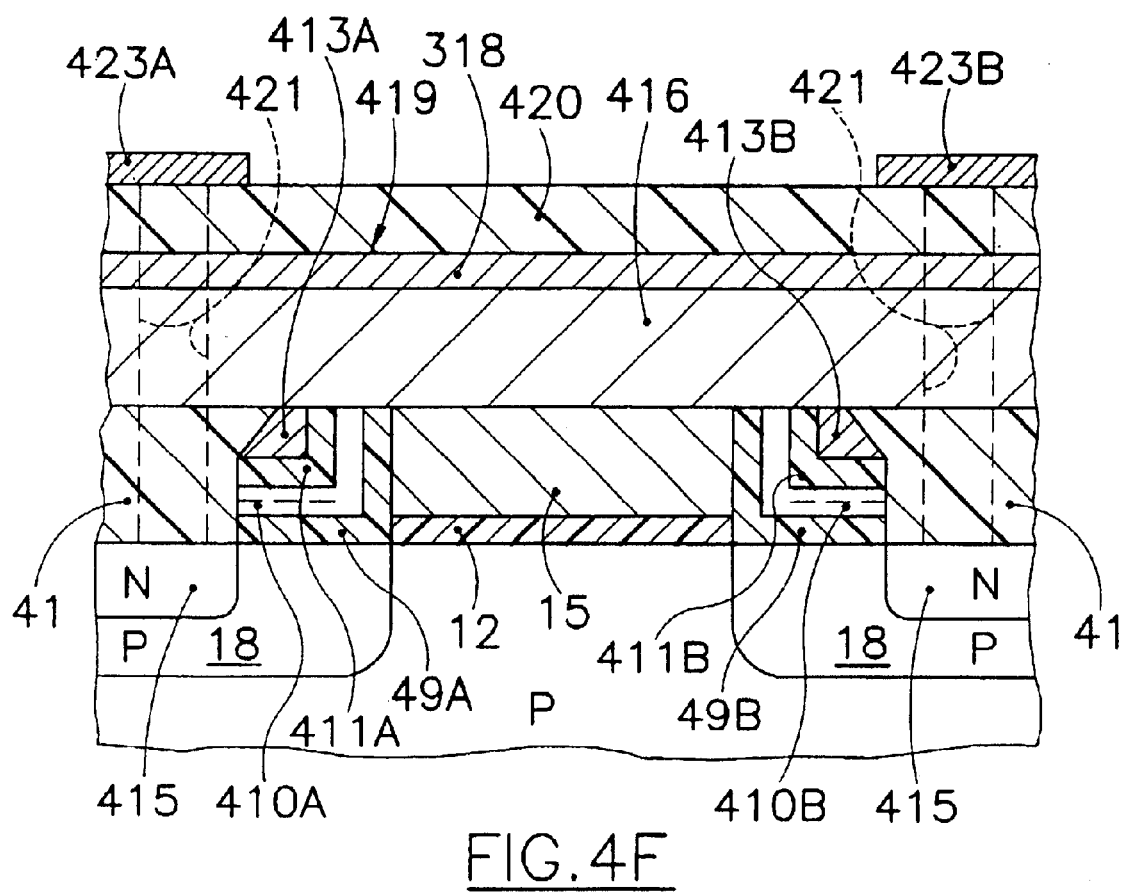
FIG. 4F is an enlarged cross-sectional view of a dual charge storage location memory cell obtained by the process according to the fourth embodiment of the invention.

Referring to FIG. 4F, a conventional dielectric stack 420 with good ionic gettering properties is then placed over the top surface of the structure. As in the previous embodiments, contact openings 421 are formed in the dielectric layer 420 down to the surface of the bit line diffusions 415 outside memory cells sub-arrays. By means of conventional contact formation and metallization techniques metal bit lines 423A, 423B are defined running transversally to the word lines 419 over the bit line diffusions 415 and contacting the latter in prescribed areas outside the memory cell sub-arrays. Different arrangements of the metal bit lines are possible.

The memory cell obtained by the process according to this fourth embodiment is functionally equivalent to that depicted in FIG. 1N, and can be represented by the electrical equivalent circuit of FIG. 1P. Structurally, the memory cell of FIG. 4F differs from that of FIG. 1N for the fact that the space between the spacers 413A, 413B is not filled by polysilicon, but by dielectric. In this way, the parasitic capacitance of the word line 419 is significantly reduced. In fact, the capacitive coupling of the word line with the bit line diffusions 415 is smaller compared to the structure of FIG. 1N. The spacers 413A, 413B, which form the gates of the transistors T1 and T3, are electrically connected to the word line 419 thanks to the fact that they have a small flat top surface. Additionally, thanks to the physical separation of the "L"-shaped ONO stack portions of adjacent memory cells along a same word line, the confinement of the charge in the nitride layer portions 410A, 410B is assured, and it is avoided any possible sharing of charge between two adjacent memory cells.

The dual charge storage location memory cells fabricated by the processes previously described are characterized by the fact of having two physically separated "L"-shaped ONO stack portions, each one at a respective side of the gate of the central transistor T2. The "L"-shaped ONO stack portions comprise each a base portion lying on the substrate surface, and an upright portion lying on a respective side of the gate of the central transistor. In the first three embodiments previously described, the "L"-shaped ONO stack portions at the sides of the gate of a given memory cells are connected to the "L"-shaped ONO stack portions of the two adjacent memory cells along the word line of the memory cell array. Differently, in the fourth embodiment the "L"-shaped ONO stack portions of any memory cell in the array are physically separated from the "L"-shaped ONO stack portions of the adjacent memory cells along the word line.

Differently from the processes described in U.S. Pat. No. 6,248,633 B1, no disposable polysilicon sidewall spacers are used, and the process is consequently simpler.

The process according to the present invention is suitable for the manufacturing of dual charge storage location memory cells of the EPROM, EEPROM and Flash EPROM types.

The dual charge storage location memory cell realized in accordance with the process of the invention are also adapted to be used as multi-level memory cells. With reference to FIG. 1P, this means that the amount of charge trapped in the charge retention element of each of the transistors T1 and T3 can take more than two values (absence of charge or presence of charge), for example four values, corresponding to four different threshold voltages. Each transistor T1 and T3 would in this case store more than one bit, for example two bits in the case of four different threshold voltages. The memory cell storage capacity is twice the storage capacity of the individual transistors T1 and T3.

Although the present invention has been disclosed and described by way of some embodiments, it is apparent to those skilled in the art that several modifications to the described embodiments, as well as other embodiments of the present invention are possible without departing from the scope thereof as defined in the appended claims.

For example, although in the present description reference has always been made to ONO sandwiches, this is not to be considered a limitation for the present invention. Other types of materials may in fact be used. For example, the silicon nitride layer may be substituted for by a different charge trapping dielectric material. Also, one or both of the silicon dioxide layers forming the bottom and top layers of the ONO sandwich may be substituted for by different dielectrics, particularly high-k (i.e., high dielectric constant) dielectrics such as the promising $ZrO_2$ and $HfO_2$.

What is claimed is:

1. A process for manufacturing a dual charge storage location electrically programmable memory cell, comprising the steps of:

forming a central insulated gate over a substrate;

forming at the sides of the central insulated gate write enhancement doped regions of a first conductivity type having respective doping levels higher than that of the substrate;

forming a plurality of charge-storage elements over the substrate and adjacent to respective portions of the central insulated gate;

forming a respective side control gate over each of the charge-storage elements, each of the side control gates electrically coupled to the central insulated gate; and forming a respective source/drain regions in the semiconductor substrate adjacent to each charge-storage element.

2. The process of claim 1, wherein each charge-storage element comprises a layer of a charge-trapping material sandwiched between opposing layers of a dielectric material.

3. The process of claim 1, wherein one layer of a dielectric material of the charge storage-element lies adjacent to both a portion of the substrate and a portion of a side of the central insulated gate, the portion of the charge-storage element adjacent to the substrate forming a base charge-confining layer and the portion adjacent to the central insulated gate forming an upright charge-confining layer.

4. The process according to claim 1, wherein the charge-trapping material is a silicon nitride.

5. The process according to claim 1, wherein the dielectric material is a silicon oxide.

6. A dual charge storage location electrically programmable memory cell, the cell comprising:
   an insulated central gate placed over a substrate;
   a plurality of physically separated side control gates located over the substrate and adjacent to portions of the insulated central gate, each side control gate including a charge-storage element comprising a layer of charge-trapping material sandwiched between opposing layers of a dielectric material, wherein the dielectric layers are high dielectric constant material layers;
   a drain region and a source region formed in the semiconductor substrate, both regions being laterally separated by the insulated central gate; and
   an electrical connection element connecting the side control gates and the insulated central gate.

7. The memory cell of claim 6, wherein one layer of the dielectric material of the charge storage-element lies adjacent to both a portion of the substrate and a portion of a side of the insulated central gate, the portion of the charge-storage element adjacent to the substrate forming a base charge-confining layer and the portion adjacent to the insulated central gate forming an upright charge-confining layer.

8. The memory cell of claim 6, wherein the charge-trapping material is a layer of silicon nitride.

9. The memory cell of claim 6, wherein the dielectric material is a layer of silicon oxide.

10. A process for manufacturing a dual charge storage location electrically programmable memory cell, comprising the steps of:
    forming a central insulated gate over a semiconductor substrate;
    forming in the substrate a doped region having a higher doping level than that of a body region of the semiconductor substrate;
    forming physically separated charge-confining layers stack portions of a dielectric/charge trapping material/dielectric layers stack at the sides of the central insulated gate, the charge trapping material layer in each charge-confining layers stack portion forming a charge storage element;
    forming side control gates over each of the charge-confining layer stack portions;
    forming memory cell source/drain regions laterally to the side control gates; and
    electrically connecting the side control gates to the central insulated gate,
    characterized in that each of the charge-confining layers stack portions at the sides of the central insulated gate is formed with an "L" shape, with a base charge-confining layers stack portion contacting the doped region and an upright charge-confining layers stack portion lying against a respective side of the central insulated gate.

11. The process according to claim 10, in which the charge trapping material layer is a layer of silicon nitride.

12. The process according to claim 10, in which the dielectric layers in the charge-confining layers stack portions are silicon oxide layers.

13. A process for manufacturing a dual charge storage location electrically programmable memory cell, comprising the steps of:
    forming a central insulated gate over a semiconductor substrate;
    forming physically separated charge-confining layers stack portion of a dielectric/charge trapping material/dielectric layers stack at the sides of the central insulated gate, the charge trapping material layer in each charge-confining layers stack portion forming a charge storage element;
    forming side control gates over each of the charge-confining layers stack portions;
    forming memory cell source/drain regions laterally to the side control gates; and
    electrically connecting the side control gates to the central insulated gate,
    characterized in that each of the charge-confining layers stack portions at the sides of the central insulated gate is formed with an "L" shape, with a base charge-confining layers stack portion lying on the substrate surface and an upright charge-confining layers stack portion lying against a respective side of the central insulated gate, and wherein the dielectric layers in the charge-confining layers stack portions are high dielectric constant material layers.

14. A process for manufacturing a dual charge storage location electrically programmable memory cell, comprising the steps of:
    forming a central insulated gate over a semiconductor substrate;
    forming physically separated charge-confining layers stack portions of a dielectric/charge trapping material/dielectric levers stack at the sides of the central insulated gate, the charge trapping material layer in each charge-confining layers stack portion forming a charge storage element;
    forming side control gates over each of the charge-confining layers stack portions;
    forming memory cell source/drain regions laterally to the side control gates;
    electrically connecting the side control gates to the central insulated gate,
    characterized in that each of the charge-confining layers stack portions at the sides of the central insulated gate is formed with an "L" shape, with a base charge-confining layers stack portion lying on the substrate surface and an upright charge-confining levers stack portion lying against a respective side of the central insulated gate; and
    after forming the central insulated gate, introducing into the substrate dopants of the first conductivity type using the central insulated gate as a mask, to form write enhancement doped regions of the first conductivity type at the sides of the central insulated gate, the write enhancement regions having a doping level higher than that of the substrate.

15. A process for manufacturing a dual charge storage location electrically programmable memory cell, comprising the steps of:

forming a central insulated gate over a semiconductor substrate;

forming physically separated charge-confining layers stack portions of a dielectric/charge trapping material/dielectric layers stack at the sides of the central insulated gate, the charge trapping material layer in each charge-confining layers stack portion forming a charge storage element;

forming side control gates over each of the charge-confining layer stack portions;

forming memory cell source/drain regions laterally to the side control gates;

electrically connecting the side control gates to the central insulate gate, characterized in that each of the charge-confining layers stack portions at the sides of the central insulated gate is formed with an "L" shape, with a base charge-confining layers stack portion lying on the substrate surface and an upright charge-confining layers stack portion lying against a respective side of the central insulated gate;

forming the dielectric-charge trapping material-dielectric layers stack on the central insulated gate and on the substrate surface at the sides of the central insulated gate;

forming a first polysilicon layer on the layers stack, and anisotropically etching the first polysilicon layer to form sidewall spacers at the sides of the cental insulated gate;

introducing dopants of a second conductivity type into the substrate using the sidewall spacers as a mask, to form memory cell source/drain regions at the sides of the sidewall spacers;

forming second polysilicon layer portions on the sidewall spacers and removing the layers stack from over the central insulated gate; and covering the central insulated gate and the second polysilicon layer portions with a third polysilicon layer.

16. The process according to claim 15, in which said forming second polysilicon layer portions on the sidewall spacers and removing the layers stack from over the central insulated gate comprises the steps of:

forming a second polysilicon layer on the layers stack and on the sidewall spacers, and removing the second polysilicon layer and the layers stack down to the central insulated gate, leaving the second polysilicon layer portions to fill recesses at the sides of the sidewall spacers.

17. The process according to claim 16, in which said removing the second polysilicon layer comprises performing a plasma etch or a chemical-mechanical polishing or a combination thereof.

18. A process for manufacturing a dual charge storage location electrically programmable memory cell, comprising the steps of:

forming a central insulated gate over a semiconductor substrate;

forming physically separated charge-confining layers stack portions of a dielectric/charge trapping material/dielectric layers stack at the sides of the central insulated gate, the charge trapping material layer in each charge-confining layers stack portion forming a charge storage element;

forming side control gates over each of the charge-confining layer stack portions;

forming memory cell source/drain regions laterally to the side control gates;

electrically connecting the side control gates to the central insulated gate, characterized in that each of the charge-confining layers stack portions at the sides of the central insulated gate is formed with an "L" shape, with a base charge-confining layers stack portion lying on the substrate surface and an upright charge-confining layers stack portion lying against a respective side of the central insulated gate;

covering the central insulated gate and the substrate surface at the sides of the central insulated gate with a masking layer;

introducing dopants of a second conductivity type into the substrate to form memory cell source/drain regions, the masking layer causing the source/drain regions to be spaced apart from the sides of the central insulated gate;

removing the masking layer and covering the central insulated gate and the substrate surface with the dielectric-charge trapping material-dielectric layers stack;

forming a first polysilicon layer on the dielectric-charge trapping material-dielectric layers stack;

removing the first polysilicon layer and the dielectric-charge trapping material-dielectric layers stack down to the central insulated gate, leaving physically separated charge-confining layers stack portions of the dielectric-charge trapping material-dielectric layers stack covered by first polysilicon layer portions at the sides of the central insulated gate; and covering the central insulated gate and the first polysilicon layer portions with a second polysilicon layer.

19. The process according to claim 18, in which said covering the central insulated gate and the substrate surface at the sides of the central insulated gate with a masking layer comprises the steps of:

forming on the central insulated gate and on the substrate surface at the sides of the central insulated gate an etch-stop layer intended to act as an etch-stop in the step of removing the masking layer; and forming on the etch-stop layer the masking layer.

20. The process according to claim 19, in which said etch-stop layer is an oxide layer and said masking layer is a nitride layer.

21. The process according to claim 20, in which said removing the first polysilicon layer and the layers stack down to the central insulated gate comprises performing a plasma etch or a chemical-mechanical polishing or a combination thereof.

22. A process for manufacturing a dual charge storage location electrically programmable memory cell, comprising the steps of:

forming a central insulated gate over a semiconductor substrate;

forming physically separated charge-confining layers stack portion of a dielectric/charge trapping material/dielectric layers stack at the sides of the central insulated gate, the charge trapping material layer in each charge-confining layers stack portion forming a charge storage element;

forming side control gates over each of the charge-confining layers stack portions;

forming memory cell source/drain regions laterally to the side control gates;

electrically connecting the side control gates to the central insulated gate, characterized in that each of the charge-confining layers stack portions at the sides of the central insulated gate is formed with an "L" shape, with a base charge-confining layers stack portion lying on the substrate surface and an upright charge-confining layers stack portion lying against a respective side of the central insulated gate;

forming the dielectric-charge trapping material-dielectric layers stack on the central insulated gate and on the substrate surface at the sides of the central insulated gate;

depositing a liquid-phase gap-fill material on the dielectric-charge trapping material-dielectric layers stack and making the liquid-phase gap-fill material denser, the gap-fill material filling gaps between the dielectric-charge trapping material-dielectric layers stack at the sides of the central insulated gate and the dielectric-charge trapping material-dielectric layers stack over the central insulated gate, the latter being substantially free of gap-fill material;

removing the dielectric-charge trapping material-dielectric layers stack from over the central insulated gate using the gap-fill material as a protection to leave physically separated charge-confining layers stack portions of the dielectric-charge trapping material-dielectric layers stack at the sides of the central insulated gate;

removing the gap-fill material from over the charge-confining layer stack portions;

forming a first polysilicon layer over the central insulated gate and over the charge-confining layers stack portions at the sides thereof;

introducing dopants of a second conductivity type into the substrate using the first polysilicon layer as a mask to form source/drain regions spaced apart from the sides of the central insulated gate; and forming a second polysilicon layer over the first polysilicon layer.

23. The process according to claim 22, in which said depositing the liquid-phase gap-fill material comprises depositing the liquid-phase gap-fill material by spinning the substrate.

24. The process according to claim 23, in which said liquid-phase gap-fill material is a bottom anti-reflecting coating material or a spin-on glass.

25. A process for manufacturing a dual charge storage location electrically programmable memory cell, comprising the steps of:

forming a central insulated gate over a semiconductor substrate;

forming physically separated charge-confining layers stack portions of a dielectric/charge trapping material/dielectric layers stack at the sides of the central insulated gate, the charge trapping material layer in each charge-confining layers stack portion forming a charge storage element;

forming side control gates over each of the charge-confining layer stack portions;

forming memory cell source/drain regions laterally to the side control gates;

electrically connecting the side control gates to the central insulated gate, characterized in that each of the charge-confining layers stack portions at the sides of the central insulated gate is formed with an "L" shape, with a base charge-confining layers stack portion lying on the substrate surface and an upright charge-confining layers stack portion lying against a respective side of the central insulated gate;

forming the dielectric-charge trapping material-dielectric layers stack on the central insulated gate and on the substrate surface at the sides of the central insulated gate;

forming a first polysilicon layer on the dielectric-charge trapping material-dielectric layers stack, and etching the polysilicon layer to form sidewall spacers at the sides of the central insulated gate;

introducing dopants of a second conductivity type into the substrate using the sidewall spacers as a mask, to form source/drain regions at the sides of the sidewall spacers;

removing the dielectric-charge trapping material-dielectric layers stack from over the source/drain regions;

forming a dielectric layer over the central insulated gate and the sidewall spacers, the dielectric layer filling gaps between the sidewall spacers and the source/drain regions;

planarizing the dielectric layer down to the central insulated gate, partially removing a top portion of the central insulated gate and of the sidewall spacers to make a top surface thereof substantially flat, gap-filling portions of the dielectric layer filling gaps between the source/drain regions and the top surface of the sidewall spacers; and covering the central insulated gate, the sidewall spacers and the gap-filling portions of the dielectric layer with a polysilicon layer.

26. The process according to claim 25, in which said planarizing the dielectric layer comprises performing a plasma etch or a chemical-mechanical polishing or a combination thereof.

27. A dual charge storage location electrically programmable memory cell, comprising an insulated gate placed over a semiconductor substrate, physically separated charge-confining layers stack portions of a dielectric-charge trapping material-dielectric layers stack on a substrate surface at the sides of the insulated gate, wherein the dielectric layers are high dielectric constant material layers, the dielectric-charge trapping material layer in each charge-confining layers stack portion forming a floating gate, side control gates over each of the charge-confining layers stack portions, memory cell source/drain regions lateral to the side control gates and an electrical connection element connecting the side control gates to the insulated gate, characterized in that each of the charge-confining layers stack portions at the sides of the insulated gate has an "L" shape, with a base charge-confining layers stack portion lying on the substrate surface and an upright charge-confining layers stack portion lying against a respective side of the insulated gate.

* * * * *

UNITED STATES PATENT AND TRADEMARK OFFICE
CERTIFICATE OF CORRECTION

PATENT NO. : 6,825,523 B2
DATED : November 30, 2004
INVENTOR(S) : Paolo Caprara, Claudio Brambilla and Manilo Sergio Cereda It is certified that error appears in the above-identified patent and that said Letters Patent is hereby corrected as shown below:

Column 14,
Line 17, "portion" should be -- portions --
Lines 45 and 60, "levers" should be -- layers --

Signed and Sealed this

Twelfth Day of April, 2005

JON W. DUDAS
*Director of the United States Patent and Trademark Office*